(12) United States Patent
Yuh et al.

(10) Patent No.: US 11,903,188 B2
(45) Date of Patent: Feb. 13, 2024

(54) MEMORY DEVICES, SEMICONDUCTOR DEVICES, AND METHODS OF OPERATING A MEMORY DEVICE

(71) Applicant: TAIWAN SEMICONDUCTOR MANUFACTURING COMPANY LTD., Hsinchu (TW)

(72) Inventors: Perng-Fei Yuh, Walnut Creek, CA (US); Yih Wang, Hsinchu (TW); Meng-Sheng Chang, Hsinchu County (TW); Jui-Che Tsai, Tainan (TW); Ku-Feng Lin, New Taipei (TW); Yu-Wei Lin, Taichung (TW); Keh-Jeng Chang, Hsinchu (TW); Chansyun David Yang, Hsinchu (TW); Shao-Ting Wu, Hsinchu (TW); Shao-Yu Chou, Hsinchu County (TW); Philex Ming-Yan Fan, Tainan (TW); Yoshitaka Yamauchi, Hsinchu (TW); Tzu-Hsien Yang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 52 days.

(21) Appl. No.: 17/673,126

(22) Filed: Feb. 16, 2022

(65) Prior Publication Data
US 2023/0262969 A1    Aug. 17, 2023

(51) Int. Cl.
*G11C 17/16* (2006.01)
*H10B 20/20* (2023.01)
*G11C 17/18* (2006.01)

(52) U.S. Cl.
CPC ............. *H10B 20/20* (2023.02); *G11C 17/16* (2013.01); *G11C 17/18* (2013.01)

(58) Field of Classification Search
CPC ..................................................... G11C 17/16
(Continued)

(56) References Cited

U.S. PATENT DOCUMENTS

| 6,094,370 A * | 7/2000 | Takashima | ............. | H10B 53/00 |
| | | | | 257/E27.104 |
| 7,710,813 B1 * | 5/2010 | Im | ......................... | G11C 17/16 |
| | | | | 365/96 |

(Continued)

OTHER PUBLICATIONS

Iack,J.R.,"Electromigration—A Brief Survey and Som eRecent Results,"IEEETransactions on Electron Devices,D-16,No. 4,Apr. 1969,pp. 338-347.*

(Continued)

*Primary Examiner* — Muna A Techane
(74) *Attorney, Agent, or Firm* — WPAT LAW; Anthony King

(57) ABSTRACT

The present disclosure provides a memory device, a semiconductor device, and a method of operating a memory device. A memory device includes a memory cell, a bit line, a word line, a select transistor, a fuse element, and a heater. The bit line is connected to the memory cell. The word line is connected to the memory cell. The select transistor is disposed in the memory cell. A gate of the select transistor is connected to the word line. The fuse element is disposed in the memory cell. The fuse element is connected to the bit line and the select transistor. The heater is configured to heat the fuse element.

20 Claims, 24 Drawing Sheets

(58) Field of Classification Search
USPC .......................................................... 365/162
See application file for complete search history.

(56) References Cited

U.S. PATENT DOCUMENTS

| | | | |
|---|---|---|---|
| 2008/0048169 A1* | 2/2008 | Doyle | H10N 70/231 |
| | | | 257/209 |
| 2021/0264973 A1* | 8/2021 | Jaiswal | G11C 13/0004 |
| 2023/0099861 A1* | 3/2023 | Ramadass | H02H 9/042 |
| | | | 361/104 |

OTHER PUBLICATIONS

Lienig,J.,"Electromigration and Its Impacto nPhysica IDesign in Future Technologies,"Proceedings of the 2013 ACM International symposiumon Physical Design,Mar. 2013,pp. 33-40.*

Black, J. R., "Electromigration—A Brief Survey and Some Recent Results," IEEE Transactions on Electron Devices, ED-16, No. 4, Apr. 1969, pp. 338-347.

Lienig, J., "Electromigration and Its Impact on Physical Design in Future Technologies," Proceedings of the 2013 ACM International symposium on Physical Design, Mar. 2013, pp. 33-40.

* cited by examiner

MEMORY DEVICES, SEMICONDUCTOR DEVICES, AND METHODS OF OPERATING A MEMORY DEVICE

BACKGROUND

EFuse (electrical fuse or embedded fuse) memory devices and OTP (one-time programming) memory devices are generally used in various electronic devices, e.g., a chip or computer. EFuse memory devices and OTP memory devices may have a low density (a few kilobits), may be large in size, and may need a high voltage for programming.

BRIEF DESCRIPTION OF THE DRAWINGS

Aspects of the present disclosure are best understood from the following detailed description when read with the accompanying figures. It is to be noted that in accordance with the standard practice in the industry, various features are not drawn to scale. In fact, the dimensions of the various features may be arbitrarily increased or reduced for clarity of discussion.

DETAILED DESCRIPTION

Figures 1A, 1B, 1C:
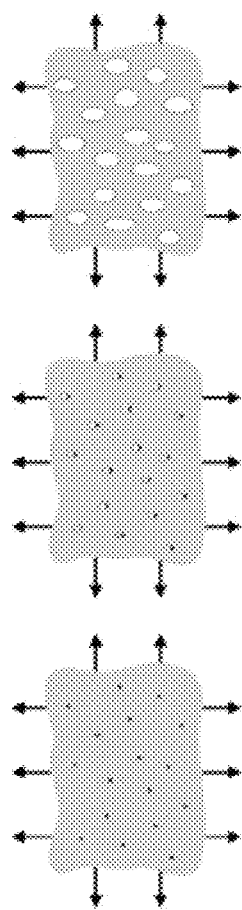
FIGS. 1A to 1C are schematic diagrams of electron migration of a material in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The nature and use of the embodiments are discussed in detail as follows. It should be appreciated, however, that the present disclosure provides many applicable inventive concepts that can be embodied in a wide variety of specific contexts. The specific embodiments discussed are merely illustrative of specific ways to embody and use the disclosure, without limiting the scope thereof.

The present disclosure may provide a memory device having a high density of memory cells by reducing the size of select transistors because of a reduction in program current. The present disclosure may provide a memory device having a low program voltage for memory cells by reducing the program current.

A large program current may be required to burn fuse elements in an eFuse memory device. The fuse element may be made of a metal, a poly silicon, a diffusion material, or combinations thereof. Either joule heat or electron migration (EM) or a combination of the two mechanisms contribute to the fuse programming, by burning the fuse elements from a low resistance state to a high resistance state or a complete open circuit. In both joule heat and electron migration mechanisms, large currents are required. Similarly for a one-time programming (OTP) memory device, a high voltage may be required to breakdown the corresponding oxide. It may require a charge pump to boost the voltage to 4-5 volt. It becomes harder for a device to sustain such high voltage.

As technology makes progress to advanced generation, scaling down the eFuse memory device becomes even harder because smaller pitch induces more parasitic resistance in the program path. Furthermore, the high program voltage that works for previous semiconductor devices induces severe voltage stress on the semiconductor devices of the advanced generation. Techniques of the advanced generation may be optimized for the process of logics or SRAM (static random access memory). EFuse elements sometimes suffer from uncontrolled or not optimized process parameters. For advanced generation, changes in eFuse architecture may be required to reduce parasitic resistance.

In the present disclosure, the proposed thermal assisted fuse or OTP cell may use a heater (e.g., a transistor, a resistor, or a combination of them) to raise the temperature of the memory element. The raised temperature can accelerate the breakdown or programming (or write) operation of the memory element. Therefore, it does not need to program the memory cell with a large current or a high voltage.

The present disclosure thus uses a smaller selector (e.g., column selectors for a bit line or row selectors for a word line) and enables a smaller cell size and an eFuse memory with a high density. The present disclosure also reduces the program voltage from a high program voltage to a lower voltage or a regular VDD. When the voltage is low, stacking device would be not necessary, and the selector's size can be reduced to one quarter. The present disclosure further improves reliability due to a lower operation voltage.

A transistor heater (e.g. a metal-oxide-semiconductor field-effect transistor; MOSFET) can be integrated with the selector with shared sources. The gate may be connected to a separate word line, different from the selector's word line. During programming, a select signal for the heater will turn on before or at the same time as the main cell selector. During reading, the select signal for the heater will be turned off. A transistor heater can be shared by several cells or can be a local heater in a per cell basis. In some embodiments, a resistive heater can be shared by several cells or can be a local heater in a per cell basis.

An eFuse bit cell is made of a fuse element in series with a NMOS (n-type metal-oxide-semiconductor) device or a PMOS (p-type metal-oxide-semiconductor) device, which is used as a selector. The fuse element may be a piece of metal, poly, contact, diffusion region, or combinations thereof. By burning the fuse elements from a low resistance state to a high resistance state or a complete open circuit, joule heat, electron migration (EM), and a combination of the two mechanisms contribute to the fuse programming. In both joule heat and electron migration mechanisms, large currents are required. Each fuse element is selected by a row decoder generating a row selection signal (x-select) to select the gate of the selector in the bit cell. A bit line (y-select) connects all the fuse elements in the y direction (or a column direction). During the read or program phase, a voltage applied to the bit line (y direction) and a decoder output for row selection (x direction) will select one bit cell. For an eFuse array, the program path resistance (Rep) may be represented as $R_{PP}=R_{fuse}+(R_{pwr}+R_{mux}+R_{bl}+R_{via}+R_{gnd})$, where the terms in parentheses may be represented as a parasitic resistance denoted as $R_{para}$. $R_{fuse}$ indicates a resistance for the fuse element. $R_{pwr}$ indicates a resistance for the power, $R_{mux}$ indicates a resistance for the multiplexer (e.g., the select transistor connected to the bit line), $R_{bl}$ indicates a resistance for the bit line, $R_{via}$ indicates a resistance for the vias, and $R_{gnd}$ indicates a resistance for the ground. The maximum power delivered to a fuse element may be $V_p^2/4R_{para}$ when $R_{fuse}=R_{para}$, where $V_p$ indicates the program voltage. The larger $R_{fuse}$ may reduce the power. The power of programing the fuse element may be determined by $R_{para}$.

FIGS. 1A to 1C are schematic diagrams of electron migration of a material in accordance with some embodiments of the present disclosure. FIGS. 1A to 1C show different phases of electron migration of a material. FIG. 1A shows impurities or inclusions in the material matrix. FIG. 1B shows void nucleation in the material. FIG. 1C shows void growth in the material. In the phase of void growth, the resistance of the material may be changed to being dramatically high. The Mean Time to Failure (MTTF) of a material caused by the electron migration may be represented as $$MTTF = \frac{A}{J^n} \times \exp\left(\frac{E_a}{k \times T}\right),$$

where A is a constant depending on the material or the cap layer surrounding the metal wire or via. J indicates the current density, T indicates the temperature, $E_a$ indicates the activation energy (e.g., 0.9V for surface diffusion), n is 1 for void growth and is 2 for void nucleation. To decrease the time to burn or program the eFuse element, the current density, the temperature, or both should be increased.

Figure 2:
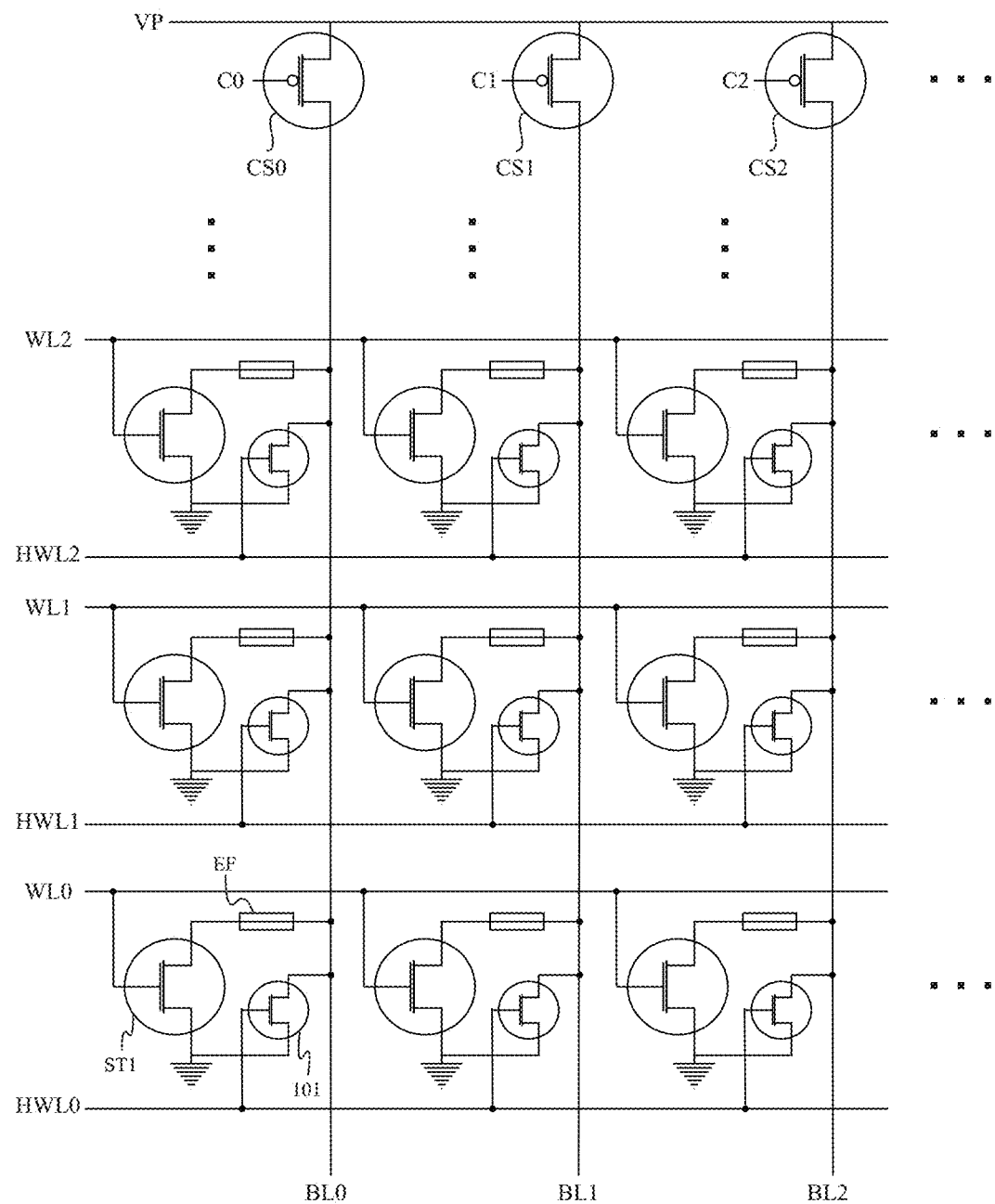
FIG. 2 is a schematic diagram of a memory device in accordance with some embodiments of the present disclosure.

FIG. 2 is a schematic diagram of a memory device 100A in accordance with some embodiments of the present disclosure. FIG. 2 discloses an exemplary circuit of the memory device 100A. The memory device 100A includes a plurality of memory cells. The memory cells of the memory device 100A may be arranged as an array. In FIG. 2, the memory cells of the memory device 100A are arranged as a two-dimensional array. In some embodiments, the memory cells of the memory device 100A may be arranged as an array with three or more dimensions.

The memory device 100A of FIG. 2 may include a plurality of word lines, a plurality of bit lines, and a plurality of heater word lines. For the purpose of simplicity and clarity, FIG. 2 shows word lines WL0, WL1, WL2, bit lines BL0, BL1, BL2, and heater word lines HWL0, HWL1, HWL2.

Each bit line is connected with a column select transistor. All the column select transistors are connected with a voltage. Each column select transistor may be controlled by a signal applied to the gate. When a column select transistor is turned on (or conducted) because of the signal applied to the gate, the voltage may be applied to the corresponding bit line. In FIG. 2, column select transistors CS0, CS1, CS2 are connected with bit lines BL0, BL1, BL2, respectively. Signals C0, C1, C2 are applied to the gate of the column select transistors CS0, CS1, CS2, respectively. Whether column select transistors CS0, CS1, CS2 are turned on (or turned off) may be controlled by the signals C0, C1, C2, respectively. For example, if the column select transistor CS0 is a p-type MOSFET, the column select transistor CS0 would be turned on when the signal C0 is a negative voltage (with sufficient magnitude). When the column select transistor CS0 is turned on, the voltage VP would be provided on the bit line BL0.

FIG. 2 shows 9 memory cells arranged in a 3-by-3 array. The memory cells in the same column are connected with the same bit line. For example, the left-most column of memory cells are connected with the bit line BL0. The memory cells in the same row are connected with the same word line. For example, the bottom row of memory cells are connected with the word line WL0. The memory cells in the same row are connected with the same heater word line. For example, the bottom row of memory cells are connected with the heater word line HWL0. Each memory cell is connected with a bit line, a word line, and a heater word line. For example, the bottom left memory cell is connected with the bit line BL0, the word line WL0, and the heater word line HWL0.

Each memory cell may include a select transistor ST1, a fuse element EF, and a heater. The fuse element EF may be an electrical fuse or an embedded fuse. In FIG. 2, the heater in a memory cell is a heating transistor 101. The select transistor ST1 may be an n-type transistor. The heating transistor 101 may be an n-type transistor.

For each memory cell, the gate of the select transistor ST1 is connected with a word line. Whether the select transistor ST1 is turned on may be determined by the signal or voltage applied to the corresponding word line. For example, the select transistor ST1 in the bottom left memory cell is connected with the word line WL0, and whether the select transistor ST1 is turned on is determined by the signal or voltage applied to the word line WL0. If the select transistor ST1 is an n-type transistor, the select transistor ST1 would be turned on when a positive voltage (with sufficient magnitude) is applied to the word line WL0. For each memory cell, the select transistor ST1 may be connected between the fuse element EF and the ground. For example, if the select transistor ST1 in the bottom left memory cell is an n-type transistor, the drain is connected to one end of the fuse element EF, and the source is connected to the ground.

For each memory cell, the fuse element EF may be connected to the corresponding bit line and the select transistor ST1. For example, in the bottom left memory cell, the fuse element EF is connected to the bit line BL0 and the select transistor ST1.

For each memory cell shown in FIG. 2, the gate of the heating transistor 101 may be connected to the corresponding heater word line. Whether the heating transistor 101 is turned on may be determined by the signal or voltage applied to the corresponding heater word line. For example, the heating transistor 101 in the bottom left memory cell is connected with the heater word line HWL0, and whether the heating transistor 101 is turned on is determined by the signal or voltage applied to the heater word line HWL0. If the heating transistor 101 is an n-type transistor, the heating transistor 101 would be turned on when a positive voltage (with sufficient magnitude) is applied to the heater word line HWL0. For each memory cell shown in FIG. 2, the heating transistor 101 may be connected between the corresponding bit line and the ground. For example, if the heating transistor 101 in the bottom left memory cell is an n-type transistor, the drain is connected to the bit line BL0 and the source is connected to the ground.

Referring to FIG. 2, if a memory cell is to be programmed (or written), the fuse element EF will be programmed. The fuse element EF may be programmed by burning the fuse element from a low resistance state to a high resistance state or to a complete open circuit. If the bottom left memory cell is to be programmed, a signal (or a voltage) will be transmitted on (or applied to) the word line WL0 to turn on the corresponding select transistors ST1 in the corresponding row, a signal C0 (or a voltage) would be transmitted to (or applied to) the column select transistor CS0 to apply the program voltage VP to the bit line BL0, and the bottom left memory cell is thus selected. Because the column select transistor CS1 and CS2 are not turned on, the program voltage VP is not applied to the bit lines BL1 and BL2 or applied to the fuse elements EF and the select transistors ST1 in the bottom center and bottom right memory cells.

If the bottom left memory cell is to be programmed, a signal (or a voltage) will be transmitted on (or applied to) the heater word line HWL0 to turn on the corresponding heating transistors 101 in the corresponding row. Because the column select transistor CS1 and CS2 are not turned on, the program voltage VP is not applied to the heating transistors 101 in the bottom center and bottom right memory cells. For a program operation, the heating transistors 101 may be turned on before or at the same time as select transistor ST1. Since the bottom left memory is selected to be programmed, the program voltage VP is applied to the fuse element EF and the heating transistor 101 in the bottom left memory cell. The fuse element EF is programmed or burned by the program voltage VP. The heating transistor 101 is enabled due to the signal on the heater word line HWL0 and the program voltage applied by the bit line BL0. A current passes through the heating transistor 101 due to the signal on the heater word line HWL0 and the program voltage applied by the bit line BL0. The heating transistor 101 heats to raise the temperature of the selected bottom left memory cell and the temperature of the fuse element EF. During a read operation of a memory cell, because a high temperature may not be required, no signal may be applied to the corresponding heater word line, and the corresponding heating transistor 101 (or other heater) may be not enabled (or not turned on).

In some embodiments, because the right end of the fuse element EF (e.g., the anode of the fuse element EF) and the heating transistor 101 are connected to the bit line, the right end of the fuse element EF may receive more heat than the left end of the fuse element EF (e.g., the cathode of the fuse element EF) does.

The exemplary characteristics of the select transistor ST1 and the heating transistor 101 are listed in the Table 1.

TABLE 1

| | Select transistor ST1 | Heating transistor 101 |
|---|---|---|
| Function | For memory selector | For heater |
| Size | 10x | 1~2x |
| Idsat | 100 mA | 10~20 mA |
| Ipgm | 10 mA | 10~20 mA |
| Rds | 6 Ω | 30~60 Ω |
| Vds | 60 mV | 1 V |
| Power | 0.6 mW | 10~20 mW |

In Table 1, Idsat indicates the drain current in the saturation region, Ipgm indicates the programming current, Rds indicates the resistance between the drain and the source, and Vds indicates the voltage difference between the drain and the source.

In some examples, the size of the select transistor ST1 may be 5 to 10 times the size of the heating transistor 101. The ratio of the size of the select transistor ST1 to the size of the heating transistor 101 may be in the range from 5 to 10. For example, the active area of the select transistor ST1 may be 5 to 10 times the size of the active area of the heating transistor 101.

The resistances Rds of the select transistor ST1 is much smaller than that of the heating transistor 101. The difference between the resistances Rds of the select transistor ST1 and that of the heating transistor 101 may be caused by their sizes.

The current Idsat of the select transistor ST1 is larger than that of the heating transistor 101. The difference between the current Idsat of the select transistor ST1 and that of the heating transistor 101 may be caused by the difference between their resistances Rds.

The voltage difference Vds of the select transistor ST1 is much smaller than that of the heating transistor 101. The difference between the voltage difference Vds of the select transistor ST1 and that of the heating transistor 101 may be caused by the voltage drop of the fuse element EF. Due to the large Vds of the heating transistor 101 with respect to that of the select transistor ST1, the power of the heating transistor 101 is larger than that of the select transistor ST1.

Due to the large power of the heating transistor 101, the heating transistor 101 may generate heat. The heat generated by the heating transistor 101 may raise the temperature of the memory cell and the temperature of the fuse element EF.

The Mean Time to Failure (MTTF) of a material caused by the electron migration may be represented as $$MTTF = \frac{A}{J^n} \times \exp\left(\frac{E_a}{k \times T}\right),$$

where A is a constant depending on the material or the cap layer surrounding the metal wire or via. J indicates the current density, T indicates the temperature, $E_a$ indicates the activation energy (e.g., 0.9V for surface diffusion), n is 1 for void growth and is 2 for void nucleation. Under a high temperature T, the MTTF would be decreased when other parameters are unchanged. Under a high temperature T, the current density J would be decreased if the MTTF is maintained the same.

If the current density J for programming the fuse element EF is decreased, the required current and/or voltage for programming the fuse element EF would be decreased. Since the current and/or voltage for programming the fuse element EF are decreased, smaller selectors (e.g., column select transistors CS0, CS1, CS2 and/or the select transistors ST1) may be used in the memory device. Since smaller selectors are used in the memory device, the memory device having a high density of memory cells may be realized through the same area of a semiconductor wafer. Since the decreased current and/or voltage for programming the fuse element EF are applied, the reliability of the memory device would be improved.

Figure 3A:
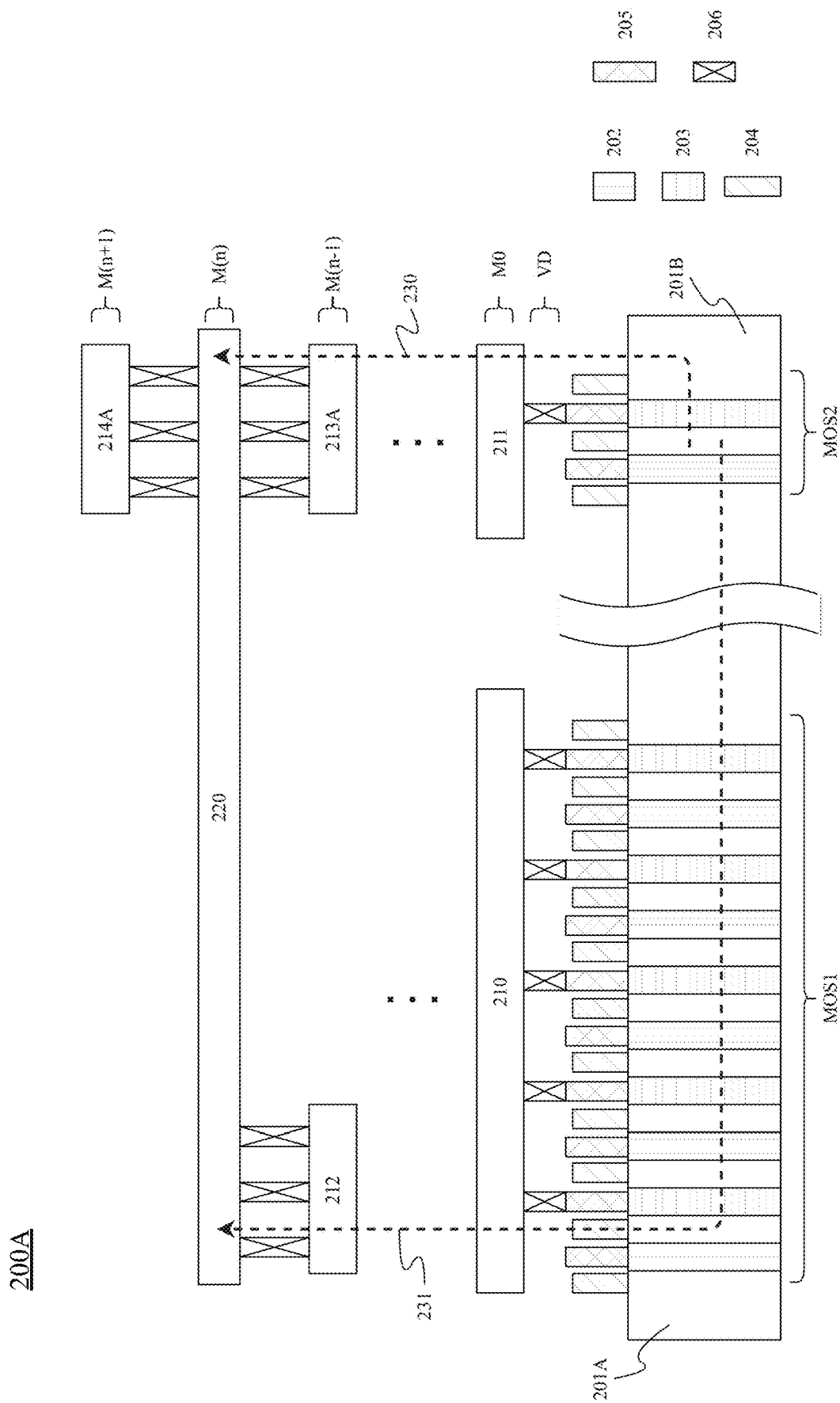
FIGS. 3A and 3B are cross-sectional views of semiconductor devices in accordance with some embodiments of the present disclosure.

FIG. 3A is a cross-sectional view of a semiconductor device 200A in accordance with some embodiments of the present disclosure. For the purposes of simplicity and clarity, the passivation layers and inter-metal dielectric layers are not shown in FIG. 3A or other drawings of the present disclosure. The semiconductor device 200A includes oxide diffusion (OD) regions 201A and 201B, source/drain regions 202 and 203, and gate layers 204 (e.g., polysilicon layers).

The transistor MOS1 may be formed on the OD region 201A, and the transistor MOS2 may be formed on the OD region 201B. In some embodiments, the transistor MOS1 may be the select transistor ST1 shown in FIG. 2, and the transistor MOS2 may be the heating transistor 101 shown in FIG. 2. In some embodiments, the OD regions 201A and 201B may be the same OD region.

The semiconductor device 200A includes metal layers 205. The metal layer 205 may be formed on the source/drain regions 202 and 203. A metal layer 205 may be referred to as a metal layer over an oxide diffusion region (MD). The semiconductor device 200A includes vias 206. In the semiconductor device 200A, some vias 206 are formed on the metal layer 205. A via 206 formed on the metal layer 205 may be referred to as a via over an oxide diffusion region (VD).

The semiconductor device 200A includes metal layers 210 and 211. The metal layers 210 and 211 may be formed at the level of metal layer M0. The metal layer 210 may be connected with the source/drain regions 203 in the OD region 201A through the metal layers 205 (e.g., MD) and the vias 206 (e.g., VD). If the MOS1 transistor is an n-type MOS, the source/drain regions 203 connected to the metal layer 210 may be operated as drains. The metal layer 210 may be connected to the metal layer 220 (e.g., the fuse element). The metal layer 211 may be connected with the source/drain region 203 in the OD region 201B through the metal layer 205 (e.g., MD) and the via 206 (e.g., VD). If the MOS2 transistor is an n-type MOS, the source/drain region 203 connected to the metal layer 211 may be operated as a drain. The metal layer 211 may be connected to the bit line (e.g., the metal layer 214A itself or through the metal layer 214A). The source/drain regions 202 and the metal layers 205 on the source/drain regions 202 may be connected to at least one metal layer and at least one via which are not shown in the cross section view of FIG. 3A. The gate layers 204 may be connected to at least one metal layer and at least one via which are not shown in the cross section view of FIG. 3A.

The semiconductor device 200A includes metal layers 212 and 213A. The metal layers 212 and 213A may be formed at the level of metal layer M(n−1). The metal layer 212 may be connected with the metal layer 210 through one or more metal layers and one or more vias formed between the metal layers 210 and 212. The metal layer 213A may be connected with the metal layer 211 through one or more metal layers and one or more vias formed between the metal layers 211 and 213A.

The semiconductor device 200A includes metal layer 220. The metal layer 220 may be connected with the metal layers 212 and 213A through vias 206. The metal layer 220 may be formed at the level of metal layer M(n). The metal layer 220 may be a weak link. The metal layer 220 may be a memory element to be programmed (or written) and read. The metal layer 220 may be a memory element to be programmed to have a high resistance value or to be an open circuit. The metal layer 220 may be a fuse element EF as shown in FIG. 2 or other figures.

The semiconductor device 200A includes metal layer 214A. The metal layer 214A may be connected with the metal layer 220 through vias 206. The metal layer 214A may be formed at the level of metal layer M(n+1). The metal layer 214A may be connected to a bit line as shown in FIG. 2. The metal layer 214A may be a bit line as shown in FIG. 2.

The heat generated by the transistor MOS2 may be transferred or conducted through the paths indicated by the dashed lines 230 and 231. Along the path indicated by the dashed line 230, the heat generated by the transistor MOS2 may be transferred or conducted from the source/drain regions 202 and 203, the metal layer 205, the via 206 on the metal layer 205, the metal layer 211, the metal layer 213A, the vias 206 on the metal layer 213A, and the metal layer 220. In some embodiments, the heat generated by the transistor MOS2 may be transferred or conducted to the metal layer 214A. The at least one metal layer and the at least one via formed to be connected with the metal layers 211 and 213A are not shown for the purpose of simplicity and clarity.

Along the path indicated by the dashed line 231, the heat generated by the transistor MOS2 may be transferred or conducted from the source/drain regions 202 and 203, the OD regions 201B and 210A, the metal layer 205, the via 206 on the metal layer 205, the metal layer 210, the metal layer 212, the vias 206 on the metal layer 212, and the metal layer 220. The at least one metal layer and the at least one via formed to be connected with the metal layers 210 and 212 are not shown for the purpose of simplicity and clarity.

With respect to the path indicated by the dashed line 231, more heat may be transferred or conducted through the path indicated by the dashed line 230 because there may be less heat loss through the path indicated by the dashed line 230. The heat loss due to the OD regions 201A and 201B in the path indicated by the dashed line 231 may be much because the OD regions 201A and 201B may not be good conductors of heat. In some embodiments, the right end of the metal layer 220 may receive more heat than the left end of the metal layer 220 does.

Figure 3B:
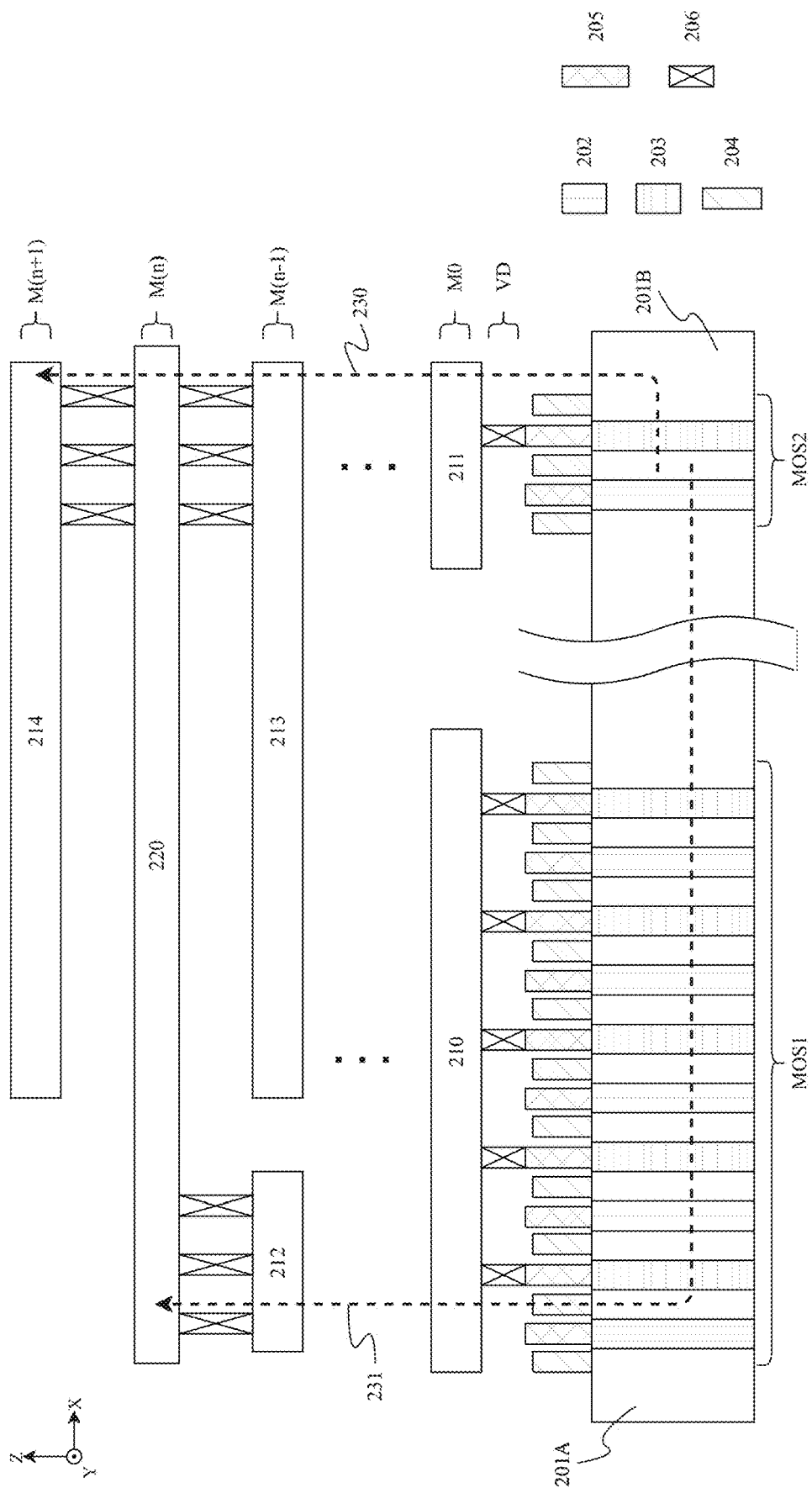

FIG. 3B is a cross-sectional view of a semiconductor device 200B in accordance with some embodiments of the present disclosure. With respect to the metal layers 213A and 214A of the semiconductor device 200A, the metal layers 213 and 214 of the semiconductor device 200B are extended. In the semiconductor device 200B, the metal layers 213 and 214 are extended to sandwich the metal layer 220. In some embodiments, the area of the metal layers 213 projected on the XY plane may be similar to, close to, or identical to the area of the metal layer 220 projected on the XY plane. The area of the metal layers 214 projected on the XY plane may be similar to, close to, or identical to the area of the metal layer 220 projected on the XY plane. The heat generated by the transistor MOS2 may be transferred or conducted to the metal layers 213 and 214. Since the metal layer 220 is sandwiched by the metal layers 213 and 214, the heat from the metal layers 213 and 214 would heat the metal layer 220 and/or keep the metal layer 220 warm.

The heat generated by the transistor MOS2 may be transferred or conducted through the path indicated by the dashed line 230. Along the path indicated by the dashed line 230, the heat generated by the transistor MOS2 may be transferred or conducted from the source/drain regions 202 and 203, the metal layer 205, the via 206 on the metal layer 205, the metal layer 211, the metal layer 213, the vias 206 on the metal layer 213A, the metal layer 220, and the metal layer 214. The at least one metal layer and the at least one via formed to be connected with the metal layers 211 and 213 may not be shown for the purpose of simplicity and clarity.

The heat transferred to the metal layer 220 causes the temperature of the metal layer 220 raise. The heat transferred to the metal layers 213 and 214 causes the temperature of the metal layers 213 and 214 raise. Since the metal layer 220 is sandwiched by the metal layers 213 and 214, the metal layer 220 may receive heat from the metal layers 213 and 214 through the inter-metal dielectric layer between the metal layers 213, 214, and 220.

Figure 4:
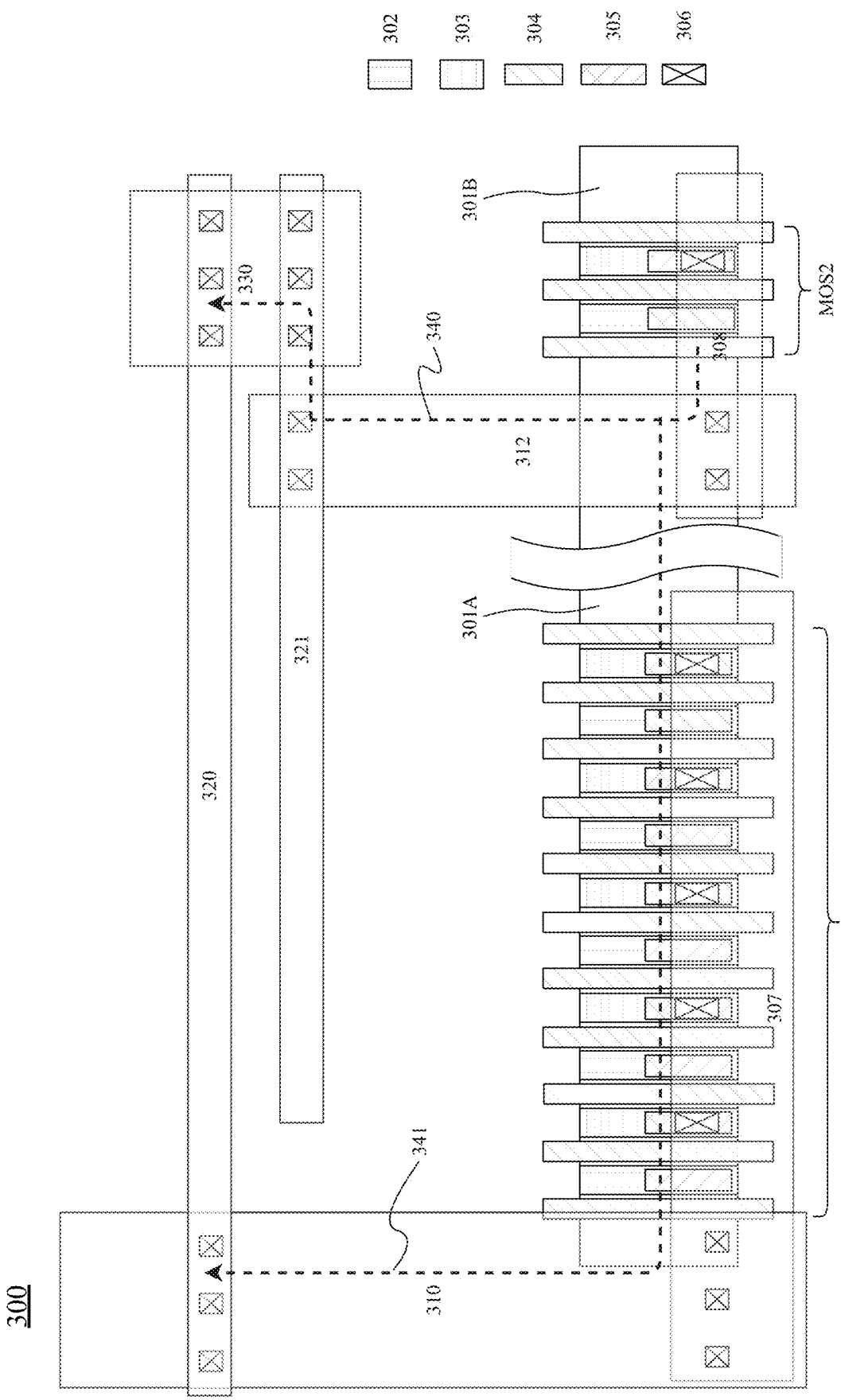
FIG. 4 is a planar view of a semiconductor device in accordance with some embodiments of the present disclosure.

FIG. 4 is a planar view of a semiconductor device 300 in accordance with some embodiments of the present disclosure. For the purposes of simplicity and clarity, the passivation layers and inter-metal dielectric layers may not be shown in FIG. 4 or other drawings of the present disclosure. The semiconductor device 300 includes oxide diffusion (OD) regions 301A and 301B, source/drain regions 302 and 303, and gate layers 304 (e.g., polysilicon layers). The transistor MOS1 may be formed on the OD region 301A, and the transistor MOS2 may be formed on the OD region 301B. In some embodiments, the transistor MOS1 may be the select transistor ST1 shown in FIG. 2, and the transistor MOS2 may be the heating transistor 101 shown in FIG. 2. In some embodiments, the OD regions 301A and 301B may be the same OD region.

The semiconductor device 300 includes metal layers 305. The metal layer 305 may be formed on the source/drain regions 302 and 303. A metal layer 305 may be referred to as a metal layer over an oxide diffusion region (MD). The semiconductor device 300 includes vias 306. In the semiconductor device 300, some vias 306 are formed on the metal layer 305. A via 306 formed on the metal layer 305 may be referred to as a via over an oxide diffusion region (VD).

The semiconductor device 300 includes metal layers 307 and 308. The metal layers 307 and 308 may be formed at the level of metal layer M0. The metal layer 307 may be connected with the source/drain regions 303 in the OD region 301A through the metal layers 305 (e.g., MD) and the vias 306 (e.g., VD). If the MOS1 transistor is an n-type MOS, the source/drain regions 303 connected to the metal layer 307 may be operated as drains. The metal layer 307 is connected to the metal layer 320 (e.g., the fuse element). The metal layer 308 may be connected with the source/drain region 303 in the OD region 301B through the metal layer 305 (e.g., MD) and the via 306 (e.g., VD). If the MOS2 transistor is an n-type MOS, the source/drain region 303 connected to the metal layer 308 may be operated as a drain. The metal layer 308 may be connected to the bit line (e.g., the metal layer 330 itself or through the metal layer 330). The source/drain regions 302 and the metal layers 305 on the source/drain regions 302 may be connected to at least one metal layer and at least one via which are not shown in FIG. 4. The gate layer 304 may be connected to at least one metal layer and at least one via which are not shown in FIG. 4.

The semiconductor device 300 includes metal layers 310 and 312. The metal layers 310 and 312 may be formed at the level of metal layer M1. The metal layer 310 may be connected with the metal layer 307 through the vias 306 formed between the metal layers 307 and 310. The metal layer 312 may be connected with the metal layer 308 through the vias 306 formed between the metal layers 308 and 312.

The semiconductor device 300 includes metal layer 320. The metal layer 320 may be connected with the metal layer 310 through the vias 306 between the metal layers 310 and 320. The metal layer 320 may be formed at the level of metal layer M2. The metal layer 320 may be a weak link. The metal layer 320 may be a memory element to be programmed (or written) and read. The metal layer 320 may be a memory element to be programmed to have a high resistance value. The metal layer 320 may be a fuse element EF as shown in FIG. 2.

The semiconductor device 300 includes metal layer 321. The metal layer 321 may be connected with the metal layer 312 through the vias 306 between the metal layers 312 and 321. The metal layer 321 may be formed at the level of metal layer M2.

The semiconductor device 300 includes metal layer 330. The metal layer 330 may be connected with the metal layer 321 through the vias 306 between the metal layers 321 and 330. The metal layer 330 may be formed at the level of metal layer M3. The metal layer 330 may be connected to a bit line as shown in FIG. 2. The metal layer 330 may be a bit line as shown in FIG. 2. The metal layer 330 may be connected with the metal layer 320 through the vias 306 between the metal layers 330 and 320.

The heat generated by the transistor MOS2 may be transferred or conducted through the paths indicated by the dashed lines 340 and 341. Along the path indicated by the dashed line 340, the heat generated by the transistor MOS2 may be transferred or conducted from the source/drain regions 302 and 303, the metal layer 308, the via 306 on the metal layer 308, the metal layer 312, the vias 306 on the metal layer 312, the metal layer 321, the vias 306 on the metal layer 321, the metal layer 330, the vias 306 between metal layers 320 and 330, and metal 320.

Along the path indicated by the dashed line 341, the heat generated by the transistor MOS2 may be transferred or conducted from the source/drain regions 202 and 203, the OD regions 301B and 310A, the metal layer 305, the via 306 on the metal layer 305, the metal layer 307, the vias 306 on the metal layer 307, the metal layer 310, the vias 306 on the metal layer 310, and the metal layer 320.

With respect to the path indicated by the dashed line 341, more heat may be transferred or conducted through the path indicated by the dashed line 340 because there may be less heat loss through the path indicated by the dashed line 340. The heat loss due to the OD regions 301A and 301B in the path indicated by the dashed line 341 may be much because the OD regions 301A and 301B may not be good conductors of heat. In some embodiments, the right end of the metal layer 320 may receive more heat than the left end of the metal layer 320 does.

Figure 5:
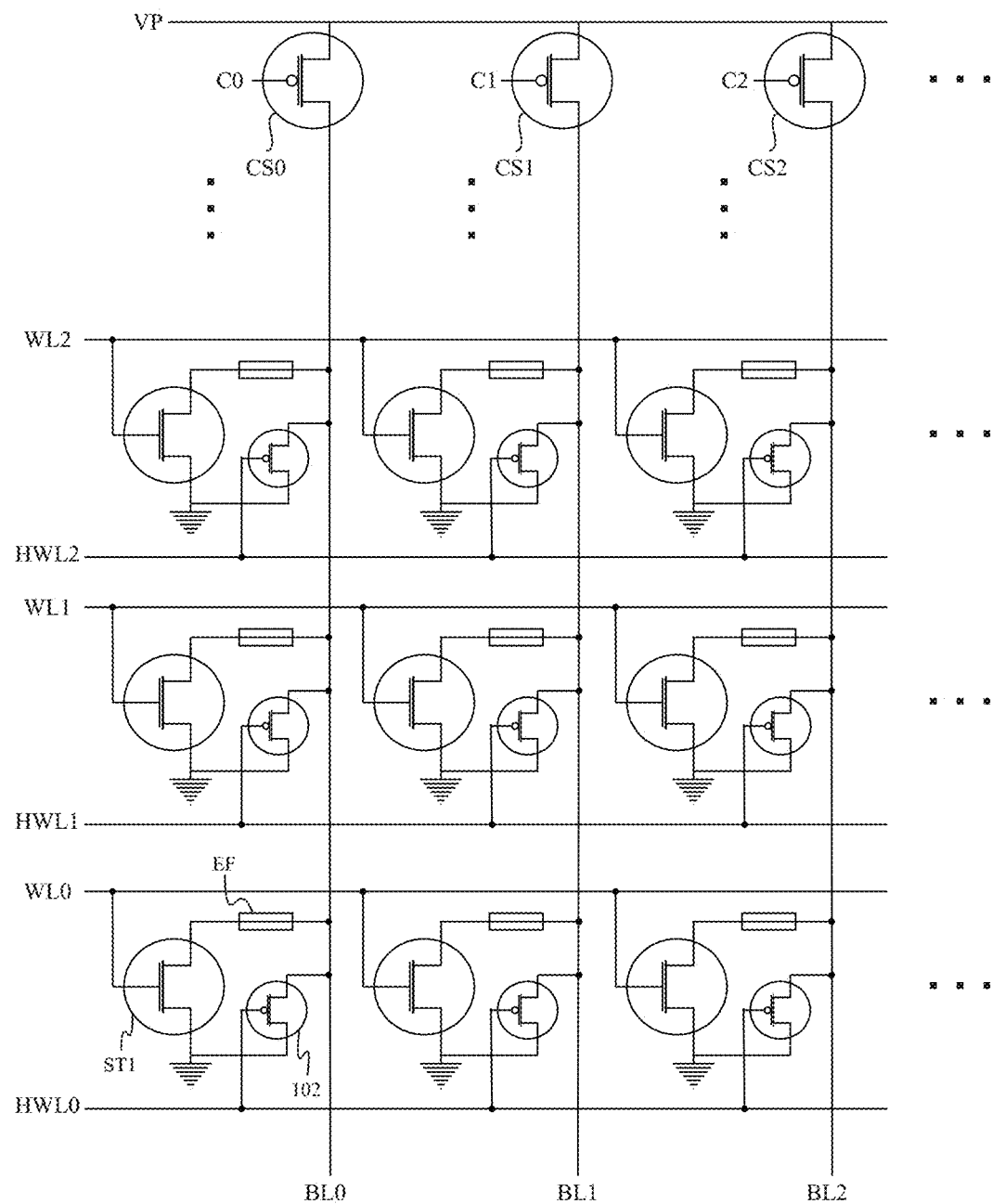
FIG. 5 is a schematic diagram of a memory device in accordance with some embodiments of the present disclosure.

FIG. 5 is a schematic diagram of a memory device 100B in accordance with some embodiments of the present disclosure. With respect to the heating transistor 101 in each memory cell of the memory device 100A in FIG. 2, each memory cell of the memory device 100B includes a heating transistor 102. The heating transistor 102 is a p-type transistor. If the heating transistor 102 is a p-type transistor, the heating transistor 102 would be turned on when a negative voltage (with sufficient magnitude) is applied to the corresponding heater word line. In FIG. 5, when the heating transistor 102 is a p-type transistor, the source of the heating transistor 102 may be connected to the corresponding bit line, and the drain of the heating transistor 102 may be connected to the ground.

Figure 6:
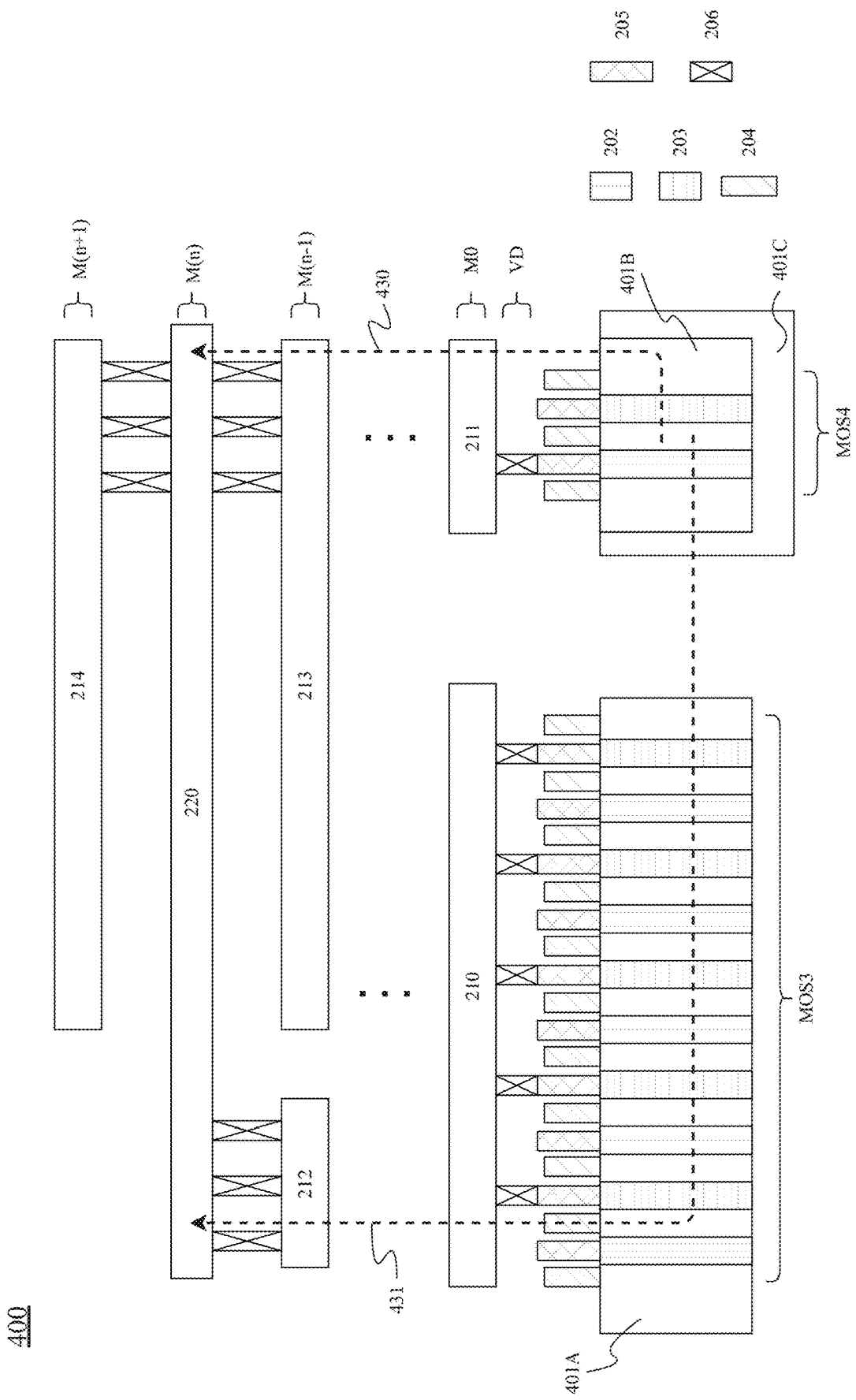
FIG. 6 is a cross-sectional view of a semiconductor device in accordance with some embodiments of the present disclosure.

FIG. 6 is a cross-sectional view of a semiconductor device 400 in accordance with some embodiments of the present disclosure. With respect to the semiconductor 200B shown in FIG. 3B, the semiconductor device 400 includes oxide diffusion (OD) regions 401A and 401B and an n-well region 401C. The transistor MOS3 may be formed on the OD region 401A, and the transistor MOS4 may be formed on the OD region 401B and the n-well region 401C. In some embodiments, the transistor MOS3 may be the select transistor ST1 shown in FIG. 5, and the transistor MOS4 may be the heating transistor 102 shown in FIG. 5.

The metal layer 210 may be connected with the source/drain regions 203 in the OD region 401A through the metal layers 205 (e.g., MD) and the vias 206 (e.g., VD). If the MOS3 transistor is an n-type MOS, the source/drain regions 203 connected to the metal layer 210 may be operated as drains. The metal layer 210 may be connected to the metal layer 220 (e.g., the fuse element). The metal layer 211 may be connected with the source/drain region 202 in the OD region 401B through the metal layer 205 (e.g., MD) and the via 206 (e.g., VD). If the MOS4 transistor is a p-type MOS, the source/drain region 202 connected to the metal layer 211 may be operated as a source. The metal layer 211 may be connected to the bit line (e.g., the metal layer 214 itself or through the metal layer 214). The source/drain regions 202 in the OD regions 401A and the corresponding metal layers 205 may be connected to at least one metal layer and at least one via which are not shown in the cross section view of FIG. 6. The source/drain regions 203 in the OD region 401B and the corresponding metal layer 205 may be connected to at least one metal layer and at least one via which are not shown in the cross section view of FIG. 6. The gate layers 204 may be connected to at least one metal layer and at least one via which are not shown in the cross section view of FIG. 6.

The heat generated by the transistor MOS4 may be transferred or conducted through the paths indicated by the dashed lines 430 and 431. Along the path indicated by the dashed line 430, the heat generated by the transistor MOS4 may be transferred or conducted from the source/drain regions 202 and 203, the metal layer 205, the via 206 on the metal layer 205, the metal layer 211, the metal layer 213, the vias 206 on the metal layer 213, and the metal layer 220. In some embodiments, the heat generated by the transistor MOS4 may be transferred or conducted to the metal layer 214. The at least one metal layer and the at least one via formed to be connected with the metal layers 211 and 213 may not be shown for the purpose of simplicity and clarity.

Along the path indicated by the dashed line 431, the heat generated by the transistor MOS4 may be transferred or conducted from the source/drain regions 202 and 203, the OD region 401B, the n-well region 401C, the OD region 401A, the metal layer 205, the via 206 on the metal layer 205, the metal layer 210, the metal layer 212, the vias 206 on the metal layer 212, and the metal layer 220. For the purpose of simplicity and clarity, the at least one metal layer and the at least one via formed to be connected with the metal layers 210 and 212 and the substrate or OD regions between the OD region 401A and n-well region 401C may not be shown.

With respect to the path indicated by the dashed line 431, more heat may be transferred or conducted through the path indicated by the dashed line 430 because there may be less heat loss through the path indicated by the dashed line 430. The heat loss due to the OD regions 401A and 401B and the n-well region 401C in the path indicated by the dashed line 431 may be much because the OD regions 401A and 401B and the n-well region 401C may not be good conductors of heat. In some embodiments, the right end of the metal layer 220 may receive more heat than the left end of the metal layer 220 does.

Figure 7:
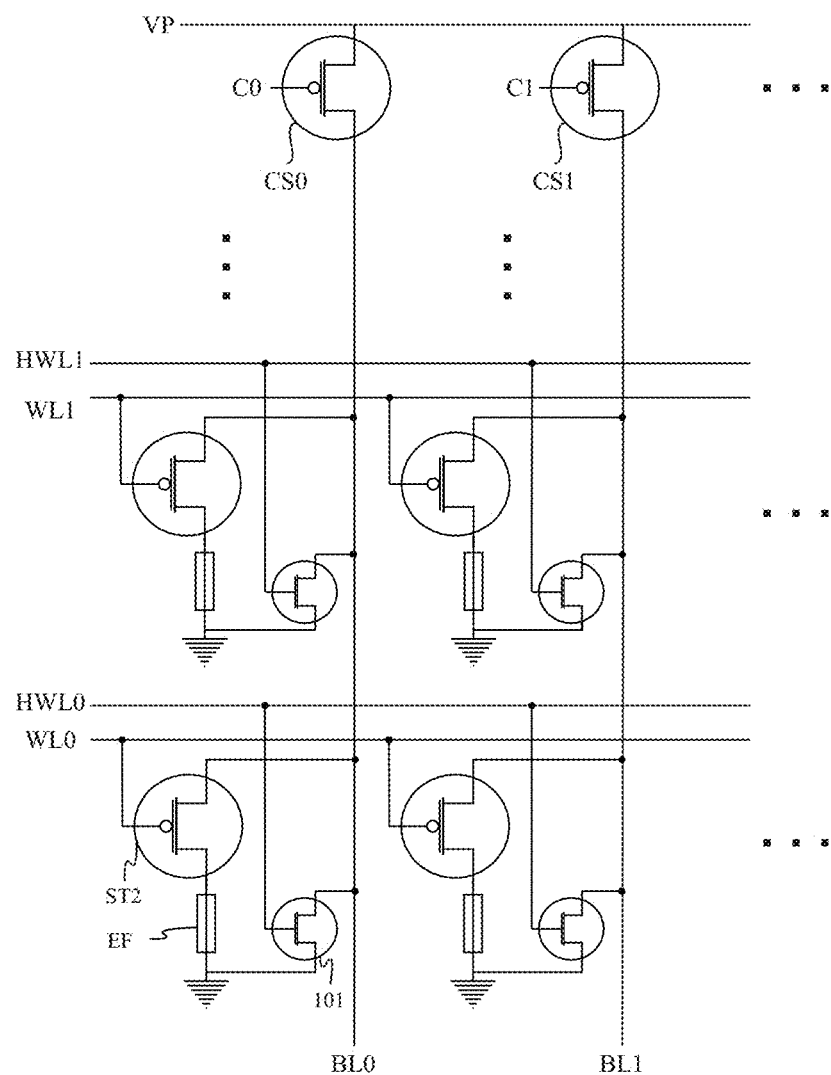
FIG. 7 is a schematic diagram of a memory device in accordance with some embodiments of the present disclosure.

FIG. 7 is a schematic diagram of a memory device 100C in accordance with some embodiments of the present disclosure. With respect to the select transistor ST1 in each memory cell of the memory device 100A in FIG. 2, each memory cell of the memory device 100C includes a select transistor ST2. The select transistor ST2 is a p-type transistor. If the select transistor ST2 is a p-type transistor, the select transistor ST2 would be turned on when a negative voltage (with sufficient magnitude) is applied to the corresponding word line. In FIG. 7, when the select transistor ST2 is a p-type transistor, the source of the select transistor ST2 may be connected to the corresponding bit line, and the drain of the select transistor ST2 may be connected to the fuse element EF.

In each memory cell of the memory device 100A shown in FIG. 2, the fuse element EF may be connected between a bit line and the drain of a select transistor ST1 (e.g., an n-type transistor). In each memory cell of the memory device 100C shown in FIG. 5, the fuse element EF may be connected between the drain of a select transistor ST2 (i.e., a p-type transistor) and the ground.

Figure 8:
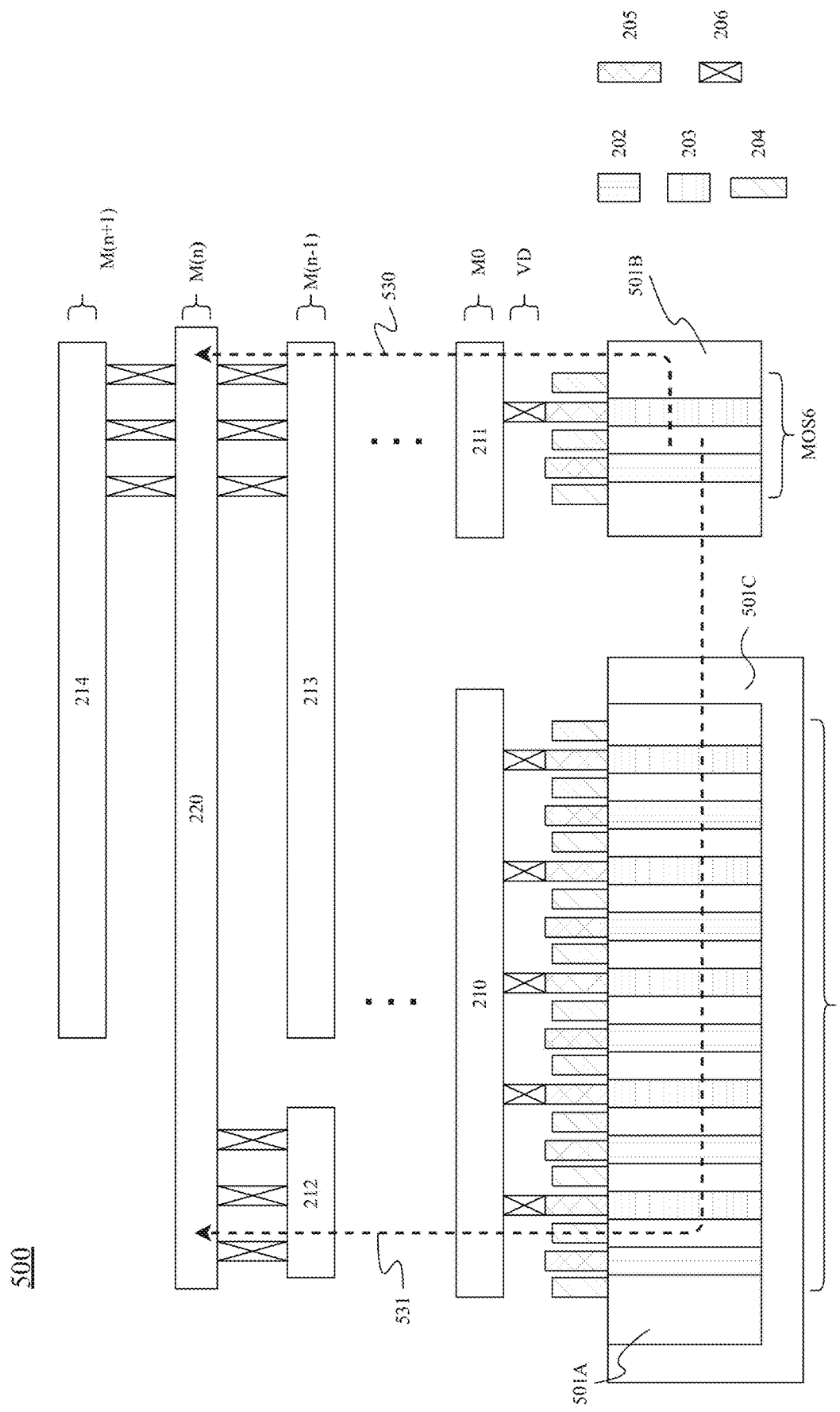
FIG. 8 is a cross-sectional view of a semiconductor device in accordance with some embodiments of the present disclosure.

FIG. 8 is a cross-sectional view of a semiconductor device 500 in accordance with some embodiments of the present disclosure. With respect to the semiconductor 200B shown in FIG. 3B, the semiconductor device 500 includes oxide diffusion (OD) regions 501A and 501B and an n-well region 501C. The transistor MOS5 may be formed on the OD region 501A and the n-well region 501C, and the transistor MOS6 may be formed on the OD region 501B. In some embodiments, the transistor MOS5 may be the select transistor ST2 shown in FIG. 7, and the transistor MOS6 may be the heating transistor 101 shown in FIG. 7.

The metal layer 210 may be connected with the source/drain regions 203 in the OD region 501A through the metal layers 205 (e.g., MD) and the vias 206 (e.g., VD). If the MOS5 transistor is a p-type MOS, the source/drain regions 203 connected to the metal layer 210 may be operated as drains. The metal layer 210 may be connected to the metal layer 220 (e.g., the fuse element). The metal layer 211 may be connected with the source/drain region 203 in the OD region 501B through the metal layer 205 (e.g., MD) and the via 206 (e.g., VD). If the MOS6 transistor is an n-type MOS, the source/drain region 203 connected to the metal layer 211 may be operated as a drain. The metal layer 211 may be connected to the bit line (e.g., the metal layer 214 itself or through the metal layer 214). The source/drain regions 202 in the OD regions 501A and the corresponding metal layers 205 may be connected to at least one metal layer and at least one via which are not shown in the cross section view of FIG. 8. The source/drain regions 202 in the OD region 501B and the corresponding metal layer 205 may be connected to at least one metal layer and at least one via which are not shown in the cross section view of FIG. 8. The gate layers 204 may be connected to at least one metal layer and at least one via which are not shown in the cross section view of FIG. 8.

The heat generated by the transistor MOS6 may be transferred or conducted through the paths indicated by the dashed lines 530 and 531. Along the path indicated by the dashed line 530, the heat generated by the transistor MOS6 may be transferred or conducted from the source/drain regions 202 and 203, the metal layer 205, the via 206 on the metal layer 205, the metal layer 211, the metal layer 213, the vias 206 on the metal layer 213, and the metal layer 220. In some embodiments, the heat generated by the transistor MOS6 may be transferred or conducted to the metal layer 214. The at least one metal layer and the at least one via formed to be connected with the metal layers 211 and 213 may not be shown for the purpose of simplicity and clarity.

Along the path indicated by the dashed line 531, the heat generated by the transistor MOS6 may be transferred or conducted from the source/drain regions 202 and 203, the OD region 501B, the n-well region 501C, the OD region 501A, the metal layer 205, the via 206 on the metal layer 205, the metal layer 210, the metal layer 212, the vias 206 on the metal layer 212, and the metal layer 220. For the purpose of simplicity and clarity, the at least one metal layer and the at least one via formed to be connected with the metal layers 210 and 212 and the substrate or OD regions between the OD region 501B and n-well region 501C may not be shown.

With respect to the path indicated by the dashed line 531, more heat may be transferred or conducted through the path indicated by the dashed line 530 because there may be less heat loss through the path indicated by the dashed line 530. The heat loss due to the OD regions 501A and 501B and the n-well region 501C in the path indicated by the dashed line 531 may be much because the OD regions 501A and 501B and the n-well region 501C may not be good conductors of heat. In some embodiments, the right end of the metal layer 220 may receive more heat than the left end of the metal layer 220 does.

Figure 9:
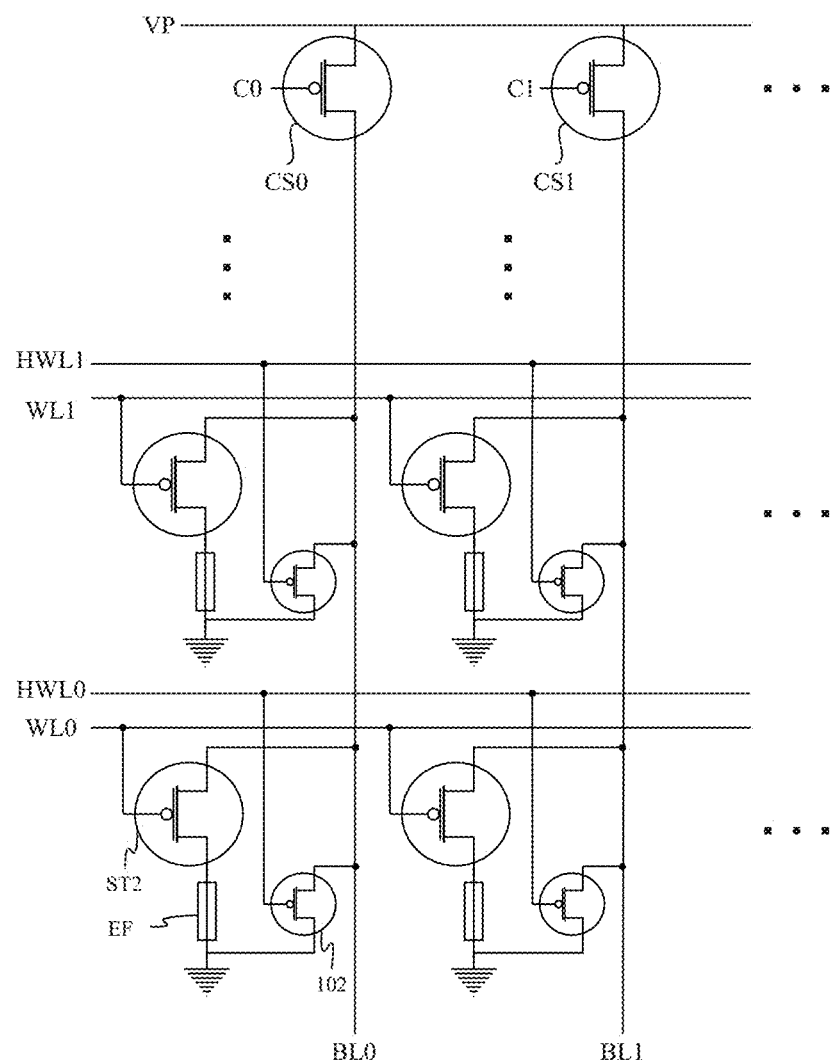
FIG. 9 is a schematic diagram of a memory device in accordance with some embodiments of the present disclosure.

FIG. 9 is a schematic diagram of a memory device 100D in accordance with some embodiments of the present disclosure. With respect to the select transistor ST1 and the heating transistor 101 in each memory cell of the memory device 100A in FIG. 2, each memory cell of the memory device 100D includes a select transistor ST2 and a heating transistor 102. The select transistor ST2 is a p-type transistor. If the select transistor ST2 is a p-type transistor, the select transistor ST2 would be turned on when a negative voltage (with sufficient magnitude) is applied to the corresponding word line. The heating transistor 102 is a p-type transistor. If the heating transistor 102 is a p-type transistor, the heating transistor 102 would be turned on when a negative voltage (with sufficient magnitude) is applied to the corresponding heater word line. In FIG. 9, when the select transistor ST2 is a p-type transistor, the source of the select transistor ST2 may be connected to the corresponding bit line, and the drain of the select transistor ST2 may be connected to the fuse element EF. When the heating transistor 102 is a p-type transistor, the source of the heating transistor 102 may be connected to the corresponding bit line, and the drain of the heating transistor 102 may be connected to the ground.

In each memory cell of the memory device 100A shown in FIG. 2, the fuse element EF may be connected between a bit line and the drain of a select transistor ST1 (e.g., an n-type transistor). In each memory cell of the memory device 100D shown in FIG. 9, the fuse element EF may be connected between the drain of a select transistor ST2 (i.e., a p-type transistor) and the ground.

Figure 10:
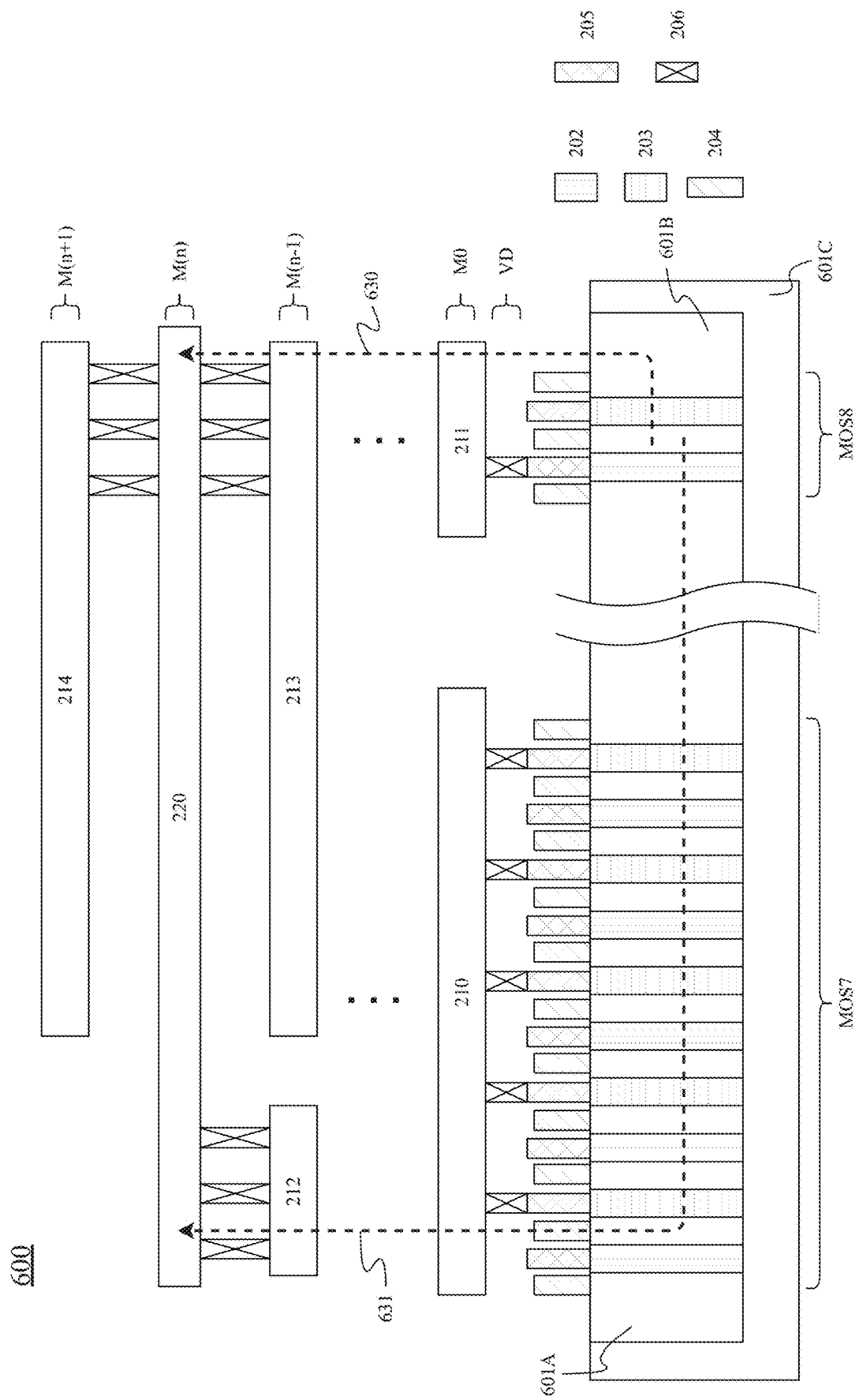
FIG. 10 is a cross-sectional view of a semiconductor device in accordance with some embodiments of the present disclosure.

FIG. 10 is a cross-sectional view of a semiconductor device 600 in accordance with some embodiments of the present disclosure. With respect to the semiconductor 200B shown in FIG. 3B, the semiconductor device 600 includes oxide diffusion (OD) regions 601A and 601B and an n-well region 601C. The transistor MOS7 may be formed on the OD region 601A and the n-well region 601C, and the transistor MOS6 may be formed on the OD region 601B and the n-well region 601C. In some embodiments, the transistor MOS5 may be the select transistor ST2 shown in FIG. 9, and the transistor MOS6 may be the heating transistor 102 shown in FIG. 9. In some embodiments, the OD regions 601A and 601B may be the same OD region.

The metal layer 210 may be connected with the source/drain regions 203 in the OD region 601A through the metal layers 205 (e.g., MD) and the vias 206 (e.g., VD). If the MOS7 transistor is a p-type MOS, the source/drain regions 203 connected to the metal layer 210 may be operated as drains. The metal layer 210 may be connected to the metal layer 220 (e.g., the fuse element). The metal layer 211 may be connected with the source/drain region 202 in the OD region 601B through the metal layer 205 (e.g., MD) and the via 206 (e.g., VD). If the MOS8 transistor is a p-type MOS, the source/drain region 202 connected to the metal layer 211 may be operated as a source. The metal layer 211 may be connected to the bit line (e.g., the metal layer 214 itself or through the metal layer 214). The source/drain regions 202 in the OD regions 601A and the corresponding metal layers 205 may be connected to at least one metal layer and at least one via which are not shown in the cross section view of FIG. 10. The source/drain regions 203 in the OD region 601B and the corresponding metal layer 205 may be connected to at least one metal layer and at least one via which are not shown in the cross section view of FIG. 10. The gate layers 204 may be connected to at least one metal layer and at least one via which are not shown in the cross section view of FIG. 10.

The heat generated by the transistor MOS8 may be transferred or conducted through the paths indicated by the dashed lines 630 and 631. Along the path indicated by the dashed line 630, the heat generated by the transistor MOS8 may be transferred or conducted from the source/drain regions 202 and 203, the metal layer 205, the via 206 on the metal layer 205, the metal layer 211, the metal layer 213, the vias 206 on the metal layer 213, and the metal layer 220. In some embodiments, the heat generated by the transistor MOS8 may be transferred or conducted to the metal layer 214. The at least one metal layer and the at least one via formed to be connected with the metal layers 211 and 213 may not be shown for the purpose of simplicity and clarity.

Along the path indicated by the dashed line 631, the heat generated by the transistor MOS8 may be transferred or conducted from the source/drain regions 202 and 203, the OD region 601B, the OD region 601A, the metal layer 205, the via 206 on the metal layer 205, the metal layer 210, the metal layer 212, the vias 206 on the metal layer 212, and the metal layer 220. For the purpose of simplicity and clarity, the at least one metal layer and the at least one via formed to be connected with the metal layers 210 and 212 and the substrate or OD regions between the OD regions 601A and 601B may not be shown.

With respect to the path indicated by the dashed line 631, more heat may be transferred or conducted through the path indicated by the dashed line 630 because there may be less heat loss through the path indicated by the dashed line 630. The heat loss due to the OD regions 601A and 601B in the path indicated by the dashed line 631 may be much because the OD regions 601A and 601B may not be good conductors of heat. In some embodiments, the right end of the metal layer 220 may receive more heat than the left end of the metal layer 220 does.

Figure 11:
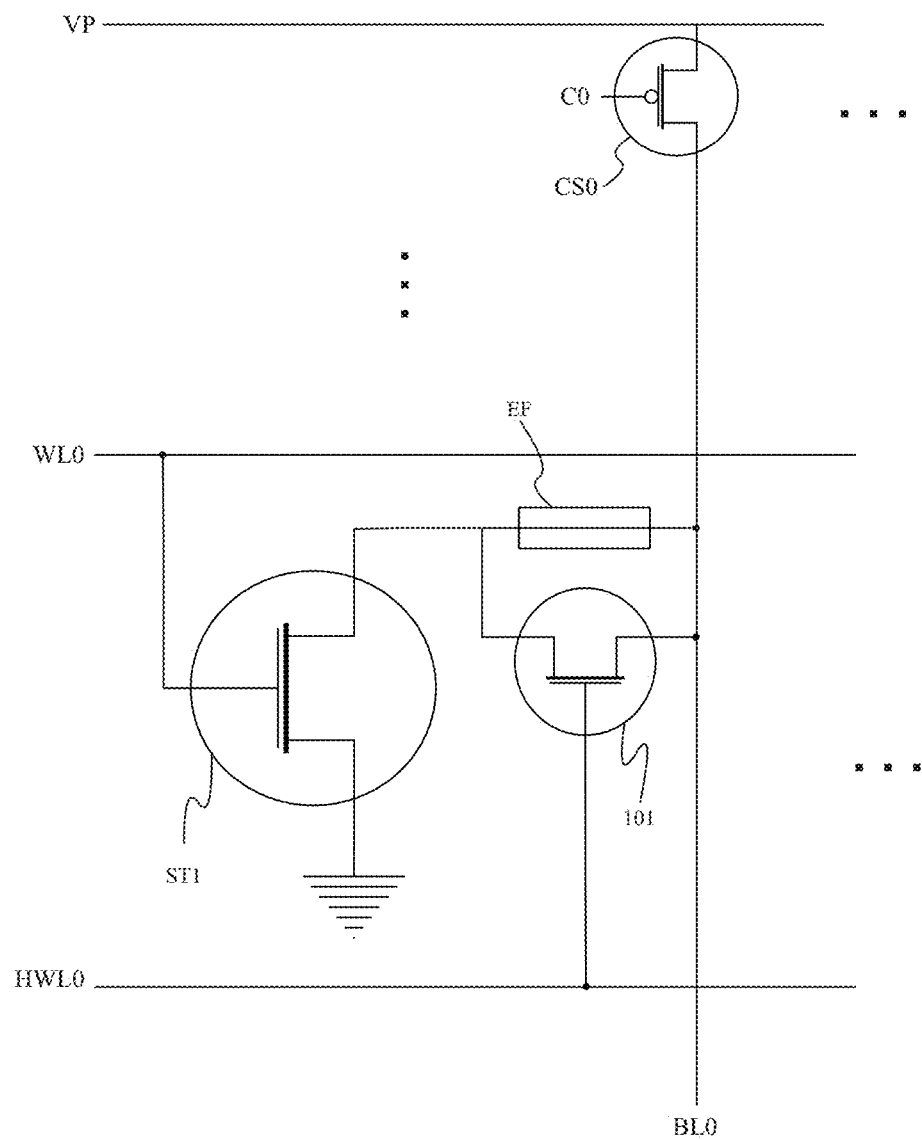
FIG. 11 is a schematic diagram of a memory device in accordance with some embodiments of the present disclosure.

FIG. 11 is a schematic diagram of a memory device 100E in accordance with some embodiments of the present disclosure. With respect to a memory cell of the memory device 100A in FIG. 2, one end of the heating transistor 101 (e.g., a drain when the heating transistor 101 is an n-type transistor) is connected to the corresponding bit line, and one end of the heating transistor 101 (e.g., a source when the heating transistor 101 is an n-type transistor) is connected to a node between the fuse element EF and the select transistor ST1. In FIG. 11, when the select transistor ST1 is an n-type transistor, the drain of the select transistor ST1 may be connected to the fuse element EF (e.g., the cathode of the fuse element EF), and the source of the select transistor ST1 may be connected to the ground.

Referring to the memory device 100A in FIG. 2, the right end of the fuse element EF (e.g., the anode of the fuse element EF) to be programmed may receive more heat than the left end of the same fuse element EF (e.g., the cathode of the same fuse element EF) does. With respect to the fuse elements EF of the memory device 100A in FIG. 2, when the heater word line HWL0 is configured to turn on the corresponding heating transistor 101 of the memory device 100E in FIG. 11 (e.g., the fuse element EF of the memory device 100E in FIG. 11 is to be programmed), both ends of the fuse element EF (e.g., the anode and the cathode of the fuse element EF) in FIG. 11 may receive substantially the same amount of heat. Both ends of the fuse element EF in FIG. 11 may receive substantially the same amount of heat since the heat generated by the heating transistor 101 may be conducted or transferred to both ends of the fuse element EF through the conductive paths connected to the source and the drain of the heating transistor 101.

Figure 12:
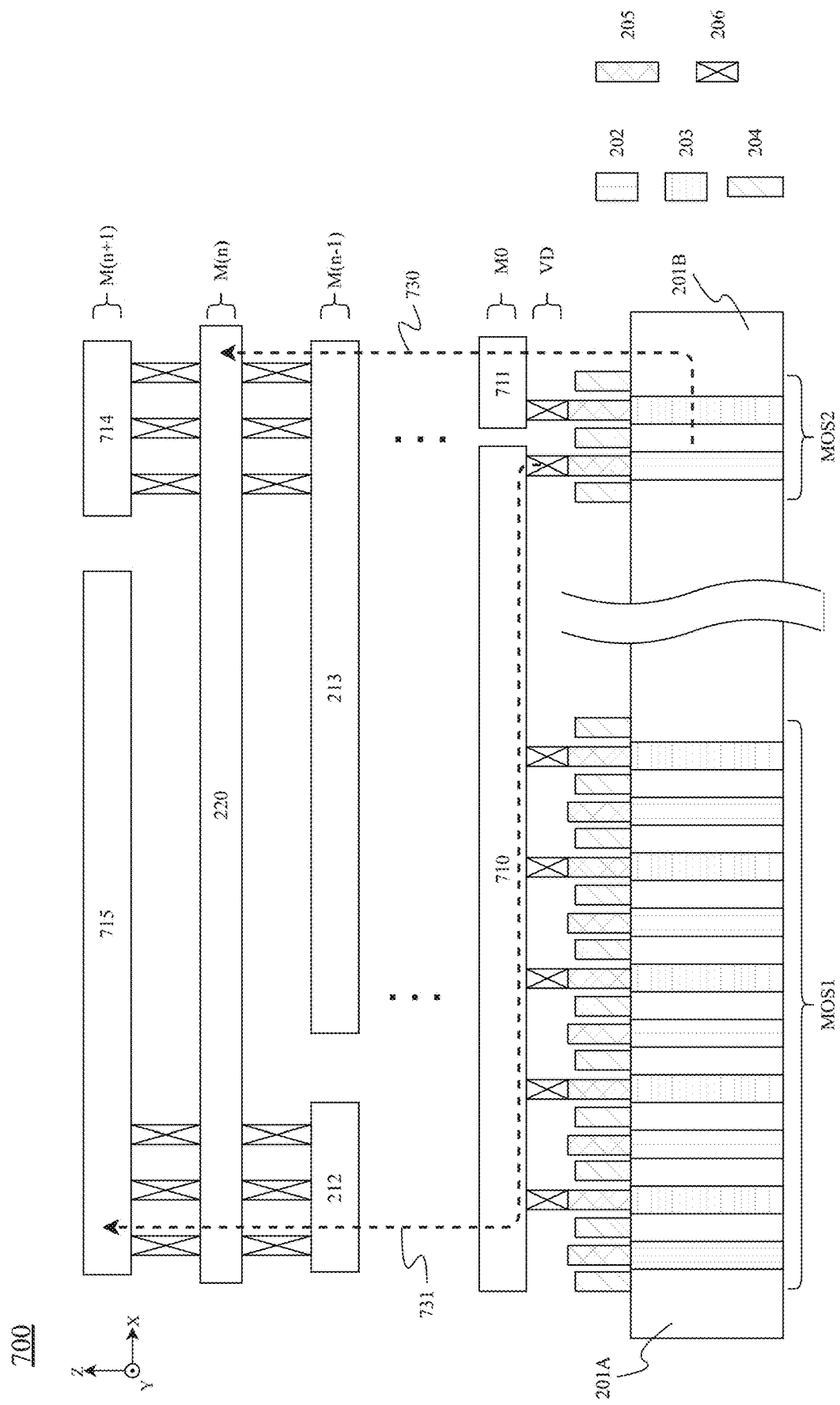
FIG. 12 is a cross-sectional view of a semiconductor device in accordance with some embodiments of the present disclosure.

FIG. 12 is a cross-sectional view of a semiconductor device 700 in accordance with some embodiments of the present disclosure. With respect to the semiconductor 200B shown in FIG. 3B, the source/drain region 202 in the OD region 201B (e.g., the source/drain region 202 of the transistor MOS2) of the semiconductor device 700 is connected to the metal layer 710 through a metal layer 205 and a via 206. In some embodiments, the transistor MOS1 in FIG. 12 may be the select transistor ST1 shown in FIG. 11, and the transistor MOS2 in FIG. 12 may be the heating transistor 101 shown in FIG. 11.

The metal layer 710 may be connected with the source/drain regions 203 in the OD region 201A through the metal layers 205 (e.g., MD) and the vias 206 (e.g., VD). If the MOS1 transistor is an n-type MOS, the source/drain regions 203 connected to the metal layer 710 may be operated as drains. The metal layer 710 may be connected to the metal layer 220 (e.g., the fuse element). The metal layer 711 may be connected with the source/drain region 203 in the OD region 201B through the metal layer 205 (e.g., MD) and the via 206 (e.g., VD). If the MOS2 transistor is an n-type MOS, the source/drain region 203 connected to the metal layer 711 may be operated as a drain. The metal layer 711 may be connected to the bit line (e.g., the metal layer 714 itself or through the metal layer 714). The metal layer 710 may be connected with the source/drain regions 202 in the OD region 201B through the corresponding metal layers 205 (e.g., MD) and the corresponding vias 206 (e.g., VD). If the MOS2 transistor is an n-type MOS, the source/drain region 202 connected to the metal layer 710 may be operated as a source. The source/drain regions 202 in the OD regions 201A and the corresponding metal layers 205 may be connected to at least one metal layer and at least one via which are not shown in the cross-sectional view of FIG. 12. The gate layers 204 may be connected to at least one metal layer and at least one via which are not shown in the cross-sectional view of FIG. 12.

With respect to the semiconductor device 200B in FIG. 3B, the semiconductor device 700 includes metal layers 714 and 715. With respect to the metal layer 214 in FIG. 3B, the metal layer 714 in FIG. 12 is shorter. The metal layer 715 of the semiconductor device 700 is extended. In the semiconductor device 700, the metal layers 213 and 715 are extended to sandwich the metal layer 220. In some embodiments, the area of the metal layer 213 projected on the XY plane may be similar to, close to, or identical to the area of the metal layer 220 projected on the XY plane. The area of the metal layer 715 projected on the XY plane may be similar to, close to, or identical to the area of the metal layer 220 projected on the XY plane. The heat generated by the transistor MOS2 may be transferred or conducted to the metal layers 213 and 715. Since the metal layer 220 is sandwiched by the metal layers 213 and 715, the heat of the metal layers 213 and 715 would heat the metal layer 220 and/or keep the metal layer 220 warm.

The heat generated by the transistor MOS2 may be transferred or conducted through the paths indicated by the dashed lines 730 and 731. Along the path indicated by the dashed line 730, the heat generated by the transistor MOS2 may be transferred or conducted from the source/drain region 203, the metal layer 205, the via 206 on the metal layer 205, the metal layer 711, the metal layer 213, the vias 206 on the metal layer 213, and the metal layer 220. In some embodiments, the heat generated by the transistor MOS2 may be transferred or conducted to the metal layer 714. The at least one metal layer and the at least one via formed to be connected with the metal layers 711 and 213 may not be shown for the purpose of simplicity and clarity.

Along the path indicated by the dashed line 731, the heat generated by the transistor MOS2 may be transferred or conducted from the source/drain region 202, the metal layer 205, the via 206 on the metal layer 205, the metal layer 710, the metal layer 212, the vias 206 on the metal layer 212, and the metal layer 220. The heat generated by the transistor MOS2 may be transferred or conducted to the metal layer 715 along the path indicated by the dashed line 731. For the purpose of simplicity and clarity, the at least one metal layer and the at least one via formed to be connected with the metal layers 710 and 212 may not be shown.

The heat transferred or conducted through the paths indicated by the dashed lines 730 and 731 may be substantially the same. The heat loss through the paths indicated by the dashed lines 730 and 731 may be substantially the same because these two paths consists of metal layers and vias. The metal layers and vias along the paths indicated by the dashed lines 730 and 731 may be good conductors of heat. The right end and the left end of the metal layer 220 may receive the same amount of heat.

Figure 13:
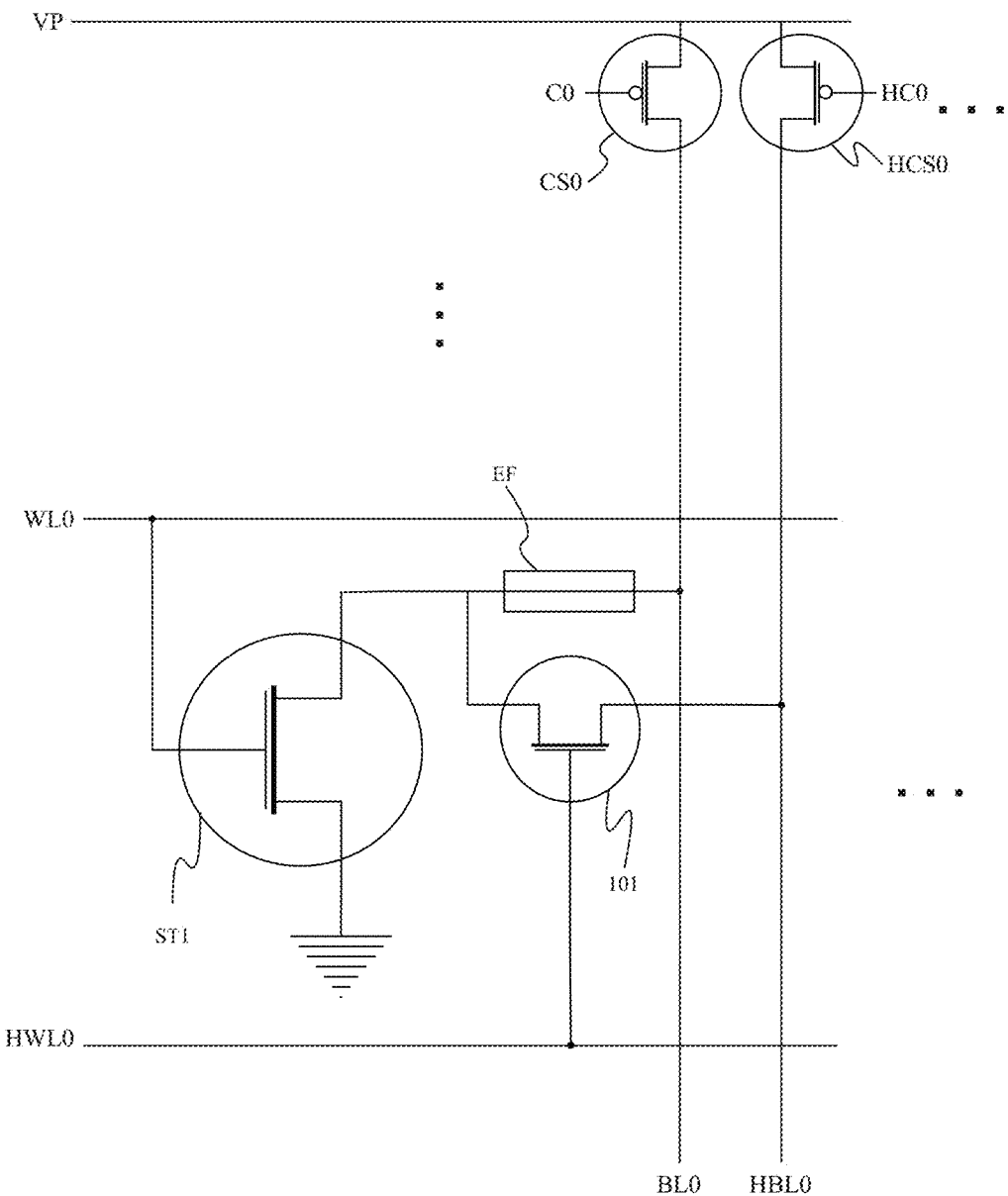
FIG. 13 is a schematic diagram of a memory device in accordance with some embodiments of the present disclosure.

FIG. 13 is a schematic diagram of a memory device 100F in accordance with some embodiments of the present disclosure. With respect to a memory cell of the memory device 100E in FIG. 11, one end of the heating transistor 101 (e.g., a drain when the heating transistor 101 is an n-type transistor) in FIG. 13 is connected to a heater bit line HBL0 adjacent to the corresponding bit line BL0, and one end of the heating transistor 101 (e.g., a source when the heating transistor 101 is an n-type transistor) in FIG. 13 is connected to a node between the fuse element EF and the select transistor ST1. In FIG. 13, when the select transistor ST1 is an n-type transistor, the drain of the select transistor ST1 may be connected to the fuse element EF (e.g., the cathode of the fuse element EF), and the source of the select transistor ST1 may be connected to the ground.

In some embodiments, one end of the heating transistor 101 (e.g., a drain when the heating transistor 101 is an n-type transistor) in FIG. 13 is connected to a heater bit line HBL0 adjacent to the corresponding bit line BL0, and one end of the heating transistor 101 (e.g., a source when the heating transistor 101 is an n-type transistor) in FIG. 13 is connected to the ground.

In FIG. 13, the bit line BL0 is connected to the column select transistor CS0. The corresponding heater bit line HBL0 is connected to the corresponding heater column select transistor HCS0. For example, when the column select transistor CS0 and the corresponding heater column select transistor HCS0 are a p-type transistor, the bit line BL0 is connected to the drain of the column select transistor CS0, and the corresponding heater bit line HBL0 is connected to the drain of the corresponding heater column select transistor HCS0. The memory device 100F may include heater bit lines HBL1 and HBL2. The heater bit line HBL1 may be connected to the heater column select transistor HCS1. The heater bit line HBL2 may be connected to the heater column select transistor HCS2. When signal C0 is applied to turn on the column select transistor CS0, the voltage VP would be provided on the bit line BL0. When signal HC0 is applied to turn on the heater column select transistor HCS0, the voltage VP would be provided on the heater bit line HBL0. When the heating transistor 101 is connected to the heater bit line separated from the corresponding bit line, an undesired voltage drop on the corresponding bit line due to the heating transistor 101 would be avoided. The fuse element EF would be programmed or read more accurately and reliably because the more accurate and reliable voltage VP is provided on the bit line.

In some embodiments, the heater bit line HBL0 and the corresponding bit line BL0 may be connected to the column select transistor CS0. For example, when the column select transistor CS0 is a p-type transistor, the heater bit line HBL0 and the corresponding bit line BL0 may be connected to the drain of the column select transistor CS0. The memory device 100F may include heater bit lines HBL1 and HBL2. The heater bit line HBL1 and the corresponding bit line BL1 may be connected to the column select transistor CS1. The heater bit line HBL2 and the corresponding bit line BL2 may be connected to the column select transistor CS2. When signal C0 is applied to turn on the column select transistor CS0, the voltage VP would be provided on the bit line BL0 and the corresponding heater bit line HBL0. When the heating transistor 101 is connected to the heater bit line separated from the corresponding bit line, an undesired voltage drop on the corresponding bit line due to the heating transistor 101 would be avoided. The fuse element EF would be programmed or read more accurately and reliably because the more accurate and reliable voltage VP is provided on the bit line.

Referring to the memory device 100E in FIG. 11, when the heater word line HWL0 is configured to turn on the corresponding heating transistor 101 of the memory device 100E in FIG. 11 (e.g., the fuse element EF of the memory device 100E in FIG. 11 is to be programmed), both ends of the fuse element EF (e.g., the anode and the cathode of the fuse element EF) in FIG. 11 may receive substantially the same amount of heat. With respect to the fuse elements EF of the memory device 100E in FIG. 11, when the heater word line HWL0 is configured to turn on the corresponding heating transistor 101 of the memory device 100F in FIG. 13 (e.g., the fuse element EF of the memory device 100F in FIG. 13 is to be programmed), the left end of the fuse element EF (e.g., the cathode of the fuse element EF) to be programmed may receive more heat than the right end of the same fuse element EF (e.g., the anode of the same fuse element EF) does. The right end of the heating transistor 101 is connected to the heater bit line. The right end of the fuse element EF is connected to the bit line. Since the heater bit line and the bit line are separated, the heat generated by the heating transistor 101 may not be easily conducted or transferred to the right end of the fuse element EF. Thus, the left end of the fuse element EF receives more heat.

Figure 14:
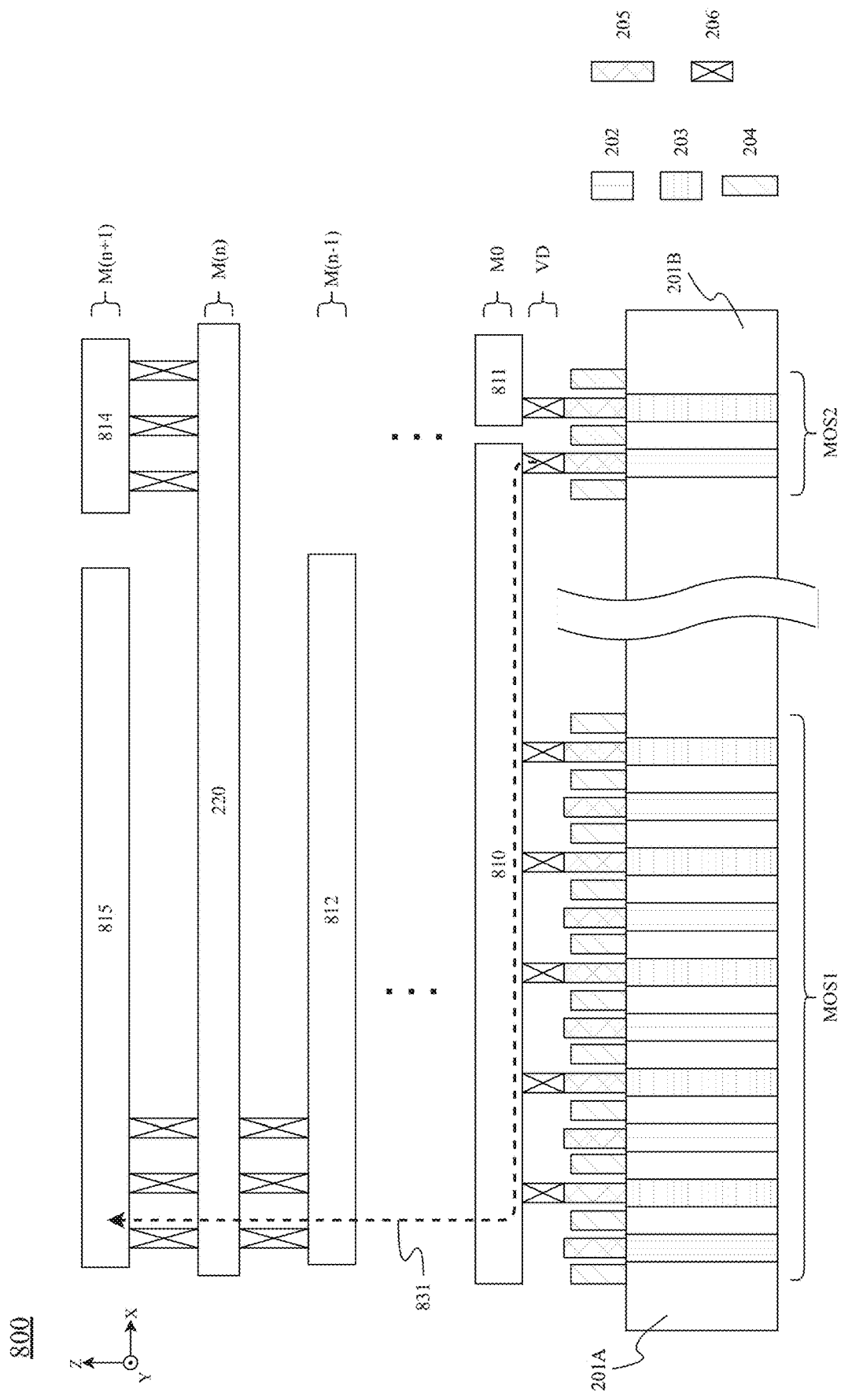
FIG. 14 is a cross-sectional view of a semiconductor device in accordance with some embodiments of the present disclosure.

FIG. 14 is a cross-sectional view of a semiconductor device 800 in accordance with some embodiments of the present disclosure. The source/drain region 202 in the OD region 201B (e.g., the source/drain region 202 of the transistor MOS2) of the semiconductor device 800 is connected to the metal layer 810 through a metal layer 205 and a via 206. The source/drain region 203 in the OD region 201B (e.g., the source/drain region 203 of the transistor MOS2) of the semiconductor device 800 is connected to the metal layer 811 through a metal layer 205 and a via 206. In some embodiments, the transistor MOS1 in FIG. 14 may be the select transistor ST1 shown in FIG. 13, and the transistor MOS2 in FIG. 14 may be the heating transistor 101 shown in FIG. 13.

The metal layer 810 may be connected with the source/drain regions 203 in the OD region 201A through the metal layers 205 (e.g., MD) and the vias 206 (e.g., VD). The metal layer 810 may be connected with the source/drain regions 202 in the OD region 201B through the corresponding metal layers 205 (e.g., MD) and the corresponding vias 206 (e.g., VD). If the MOS1 transistor is an n-type MOS, the source/drain regions 203 in the OD region 201A connected to the metal layer 810 may be operated as drains. If the MOS2 transistor is an n-type MOS, the source/drain region 202 in the OD region 201B connected to the metal layer 810 may be operated as a source. The metal layer 810 may be connected to the metal layer 220 (e.g., the fuse element).

The metal layer 811 may be connected with the source/drain region 203 in the OD region 201B through the metal layer 205 (e.g., MD) and the via 206 (e.g., VD). If the MOS2 transistor is an n-type MOS, the source/drain region 203 connected to the metal layer 811 may be operated as a drain. With respect to the semiconductor 700 shown in FIG. 12, the source/drain region 203 in the OD region 201B the semiconductor 800 shown in FIG. 14, which is connected to the metal layer 811, may not be connected to the bit line. The source/drain region 203 in the OD region 201B in FIG. 14, which is connected to the metal layer 811, may be connected to the heater bit line (e.g., the metal layer 814 itself or through the metal layer 814).

The source/drain regions 202 in the OD regions 201A and the corresponding metal layers 205 may be connected to at least one metal layer and at least one via which are not shown in the cross-sectional view of FIG. 14. The gate layers 204 may be connected to at least one metal layer and at least one via which are not shown in the cross-sectional view of FIG. 14.

The semiconductor device 800 includes metal layers 812 and 815. The metal layers 812 and 815 of the semiconductor device 800 are extended. In the semiconductor device 800, the metal layers 812 and 815 are extended to sandwich the metal layer 220. In some embodiments, the area of the metal layer 812 projected on the XY plane may be similar to, close to, or identical to the area of the metal layer 220 projected on the XY plane. The area of the metal layer 815 projected on the XY plane may be similar to, close to, or identical to the area of the metal layer 220 projected on the XY plane. The heat generated by the transistor MOS2 may be transferred or conducted to the metal layers 812 and 815. Since the metal layer 220 is sandwiched by the metal layers 812 and 815, the heat of the metal layers 812 and 815 would heat the metal layer 220 and/or keep the metal layer 220 warm.

The heat generated by the transistor MOS2 may be transferred or conducted through the path indicated by the dashed line 831. Along the path indicated by the dashed line 831, the heat generated by the transistor MOS2 may be transferred or conducted from the source/drain region 202, the metal layer 205, the via 206 on the metal layer 205, the metal layer 810, the metal layer 812, the vias 206 on the metal layer 812, and the metal layer 220. The heat generated by the transistor MOS2 may be transferred or conducted to the metal layer 815 along the path indicated by the dashed line 831. For the purpose of simplicity and clarity, the at least one metal layer and the at least one via formed to be connected with the metal layers 810 and 812 may not be shown.

The heat generated by the transistor MOS2 may not be transferred or conducted to the metal layer 220 through the source/drain region 203 in the OD region 201B, the metal layer 205, the via 206 on the metal layer 205, and the metal layer 811. The source/drain region 203 of the transistor MOS2 and the metal layer 811 may be connected to the heater bit line, which is not directly connected to the metal layer 220. Thus, heat generated by the transistor MOS2 may not be transferred or conducted to the metal layer 220 through the source/drain region 203.

The heat generated by the transistor MOS2 may only be transferred or conducted to the metal layer 220 through the path indicated by the dashed line 831. The left end of the metal layer 220 may receive heat from the transistor MOS2 through the path indicated by the dashed line 831. The right end of the metal layer 202 may rarely receive heat from the transistor MOS2.

Figure 15:
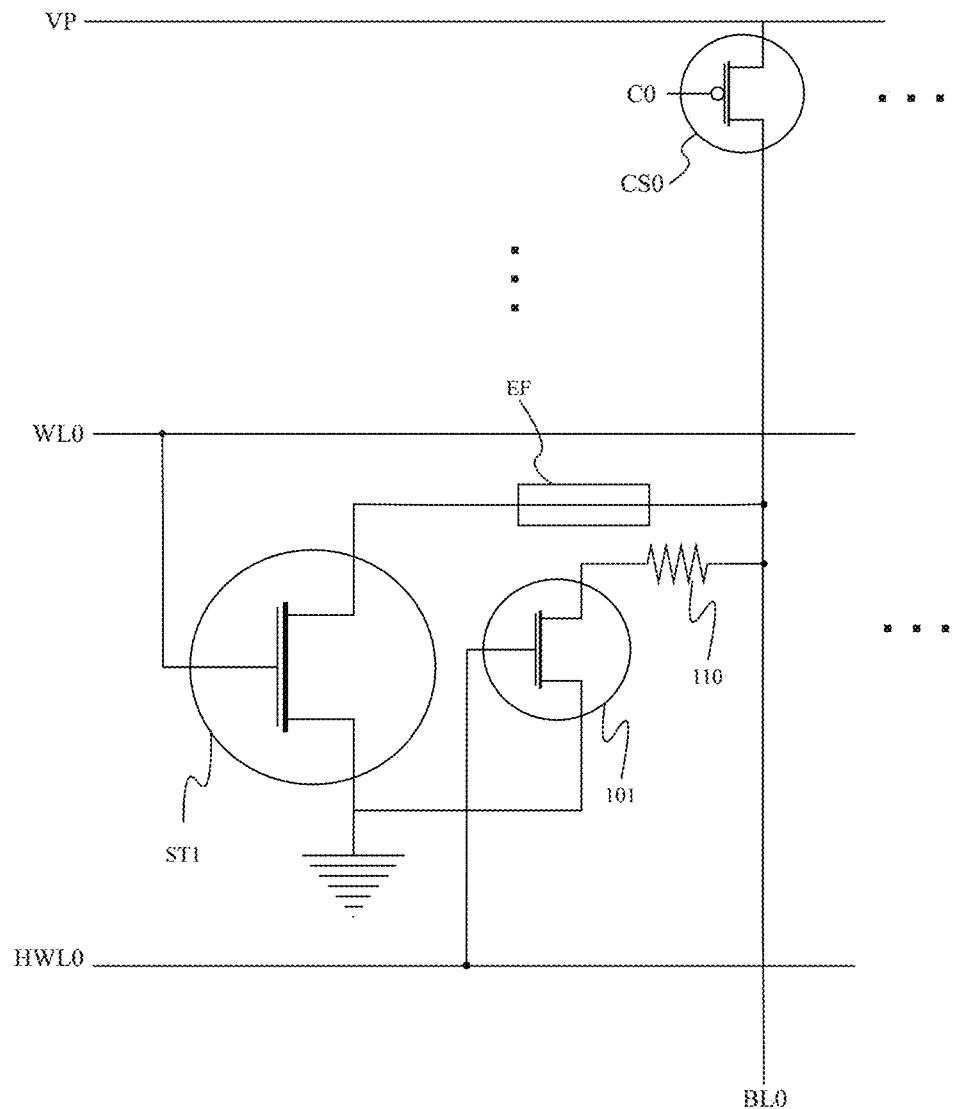
FIG. 15 is a schematic diagram of a memory device in accordance with some embodiments of the present disclosure.

FIG. 15 is a schematic diagram of a memory device 100G in accordance with some embodiments of the present disclosure. With respect to a memory cell of the memory device 100A in FIG. 2, one end of the heating transistor 101 (e.g., a drain when the heating transistor 101 is an n-type transistor) in FIG. 15 is connected to a resistor 110, and one end of the heating transistor 101 (e.g., a source when the heating transistor 101 is an n-type transistor) in FIG. 15 is connected to a node between the select transistor ST1 and the ground. One end of the resistor 110 is connected to the heating transistor 101, and the other end of the resistor 110 is connected to the corresponding bit line. In FIG. 15, when the select transistor ST1 is an n-type transistor, the drain of the select transistor ST1 may be connected to the fuse element EF (e.g., the cathode of the fuse element EF), and the source of the select transistor ST1 may be connected to the ground.

In some embodiments, one end of the resistor 110 in FIG. 15 is connected to the bit line BL0, and one end of the heating transistor 101 (e.g., a source when the heating transistor 101 is an n-type transistor) in FIG. 15 is connected to a node between the fuse element EF and the select transistor ST1.

Referring to the memory device 100A in FIG. 2, the fuse element EF to be programmed may receive the heat generated by the heating transistor 101. With respect to the fuse elements EF of the memory device 100A in FIG. 2, when the heater word line HWL0 is configured to turn on the corresponding heating transistor 101 of the memory device 100G in FIG. 15 (e.g., the fuse element EF of the memory device 100G in FIG. 15 is to be programmed), the fuse element EF in FIG. 15 receives the heat generated by the heating transistor 101 and the resistor 110. With respect to the fuse elements EF of the memory device 100A in FIG. 2, when the heater word line HWL0 is configured to turn on the heating transistor 101 and the resistor 110 of the memory device 100G in FIG. 15 (e.g., the fuse element EF of the memory device 100G in FIG. 15 is to be programmed), the fuse element EF in FIG. 15 may receive the more heat because both the heating transistor 101 and the resistor 110 generate heat.

Figure 16:
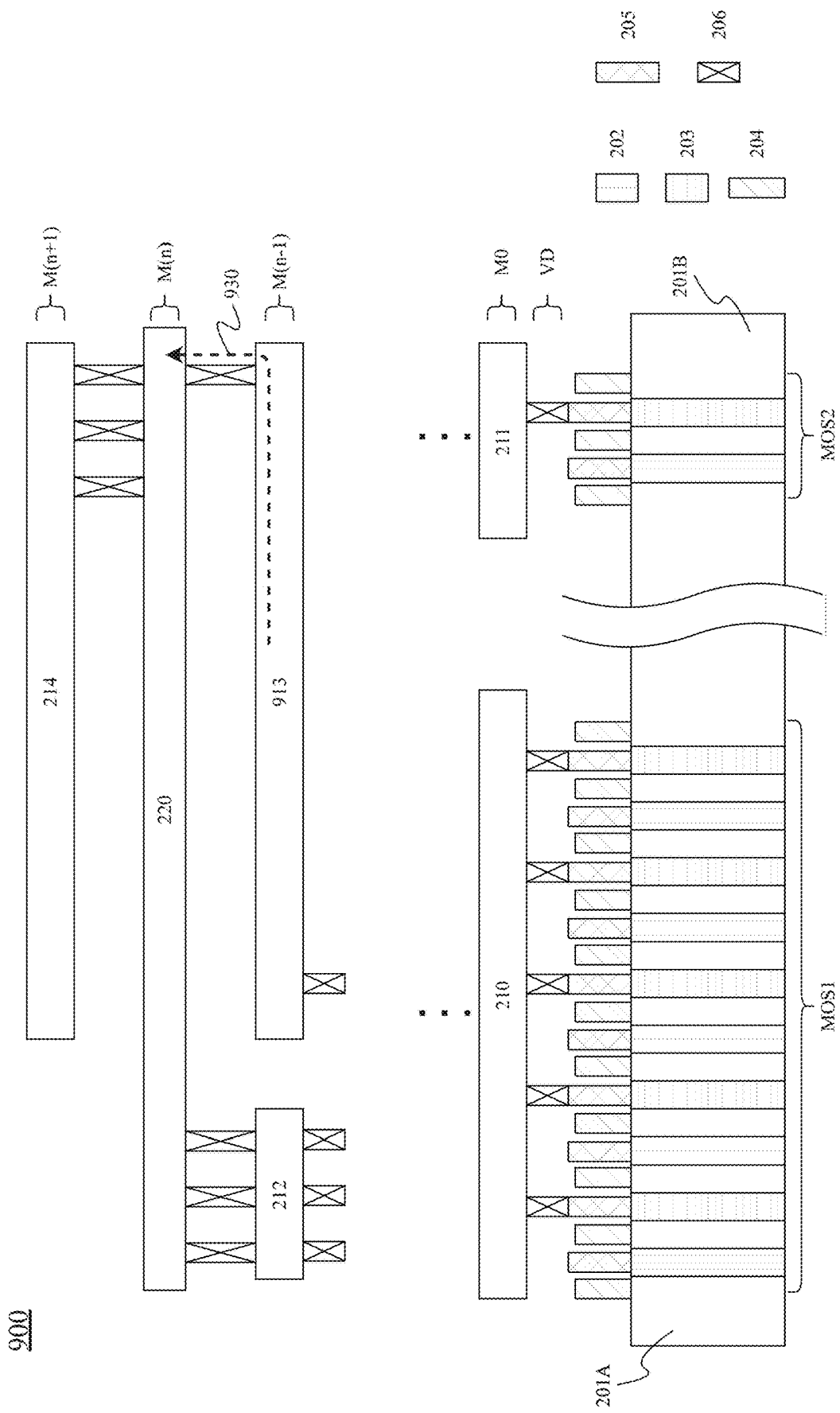
FIG. 16 is a cross-sectional view of a semiconductor device in accordance with some embodiments of the present disclosure.

FIG. 16 is a cross-sectional view of a semiconductor device 900 in accordance with some embodiments of the present disclosure. With respect to the semiconductor 200B shown in FIG. 3B, the source/drain region 203 in the OD region 201B (e.g., the source/drain region 203 of the transistor MOS2) of the semiconductor device 900 may be connected to the metal layer 913 through the metal layer 211, a metal layer 205, and a via 206. The metal layer 913 may be a resistor layer with a high resistance value. The transistor MOS1 in FIG. 16 may be the select transistor ST1 shown in FIG. 15, the transistor MOS2 in FIG. 16 may be the heating transistor 101 shown in FIG. 15, and the metal layer 913 in FIG. 16 may be the resistor 110 shown in FIG. 15. In some embodiments, the resistor 110 shown in FIG. 15 may be a via with a high resistance value in the semiconductor device 900.

The metal layer 210 may be connected with the source/drain regions 203 in the OD region 201A through the metal layers 205 (e.g., MD) and the vias 206 (e.g., VD). If the MOS1 transistor is an n-type MOS, the source/drain regions 203 connected to the metal layer 210 may be operated as drains. The metal layer 210 may be connected to the metal layer 220 (e.g., the fuse element). The metal layer 211 may be connected with the source/drain region 203 in the OD region 201B through the metal layer 205 (e.g., MD) and the via 206 (e.g., VD). If the MOS2 transistor is an n-type MOS, the source/drain region 203 connected to the metal layer 211 may be operated as a drain. The metal layer 211 may be connected to a resistor having a high resistance value (e.g., the metal layer 913) and the bit line (e.g., the metal layer 214 itself or through the metal layer 214). The source/drain regions 202 in the OD regions 201A and the corresponding metal layers 205 may be connected to at least one metal layer and at least one via which are not shown in the cross-sectional view of FIG. 16. The source/drain regions 202 in the OD regions 201B and the corresponding metal layers 205 may be connected to at least one metal layer and at least one via which are not shown in the cross-sectional view of FIG. 16. The gate layers 204 may be connected to at least one metal layer and at least one via which are not shown in the cross-sectional view of FIG. 16.

With respect to the semiconductor device 200B in FIG. 3B, the semiconductor device 900 includes metal layers 214 and 913. With respect to the metal layer 214 in FIG. 3B, the metal layer 913 in FIG. 16 may be a resistor layer with a high resistance value. The metal layer 214 (e.g., the bit line) and the metal layer 220 (e.g., the weak link or the fuse element) may be connected to the right end of the metal layer 913, and the metal layer 211 may be connected to the left end of the metal layer 913. The metal layer 913 may thus have the maximum resistance value and may generate the maximum heat.

The metal layers 214 and 913 of the semiconductor device 900 are extended. In the semiconductor device 900, the metal layers 214 and 913 are extended to sandwich the metal layer 220. In some embodiments, the area of the metal layer 214 projected on the XY plane may be similar to, close to, or identical to the area of the metal layer 220 projected on the XY plane. The area of the metal layer 913 projected on the XY plane may be similar to, close to, or identical to the area of the metal layer 220 projected on the XY plane. The heat generated by the transistor MOS2 may be transferred or conducted to the metal layers 214 and 913. Since the metal layer 220 is sandwiched by the metal layers 214 and 913, the heat of the metal layers 214 and 913 would heat the metal layer 220 and/or keep the metal layer 220 warm. Because the metal layer 913 may be a resistor layer, in addition to the heat generated from the transistor MOS2, the metal layer 913 may further generate heat. The heat generated by the metal layer 913 may be conducted or transferred to the metal layer 214. The metal layer 220 sandwiched by the metal layers 214 and 913 may receive more heat, and the temperature of the metal layer 220 may thus increase more quickly.

The heat generated by the metal layer 913 may be transferred or conducted through the path indicated by the dashed line 930. Along the path indicated by the dashed line 930, the heat generated by the metal layer 913 may be transferred or conducted to the metal layer 220 through the via 206 on the metal layer 913. In some embodiments, the heat generated by the metal layer 913 may be transferred or conducted to the metal layer 214. Because both the transistor MOS2 and the metal layer 913 generate heat, the metal layer 220 may thus receive more heat, and the temperature of the metal layer 220 may increase more quickly.

Figure 17:
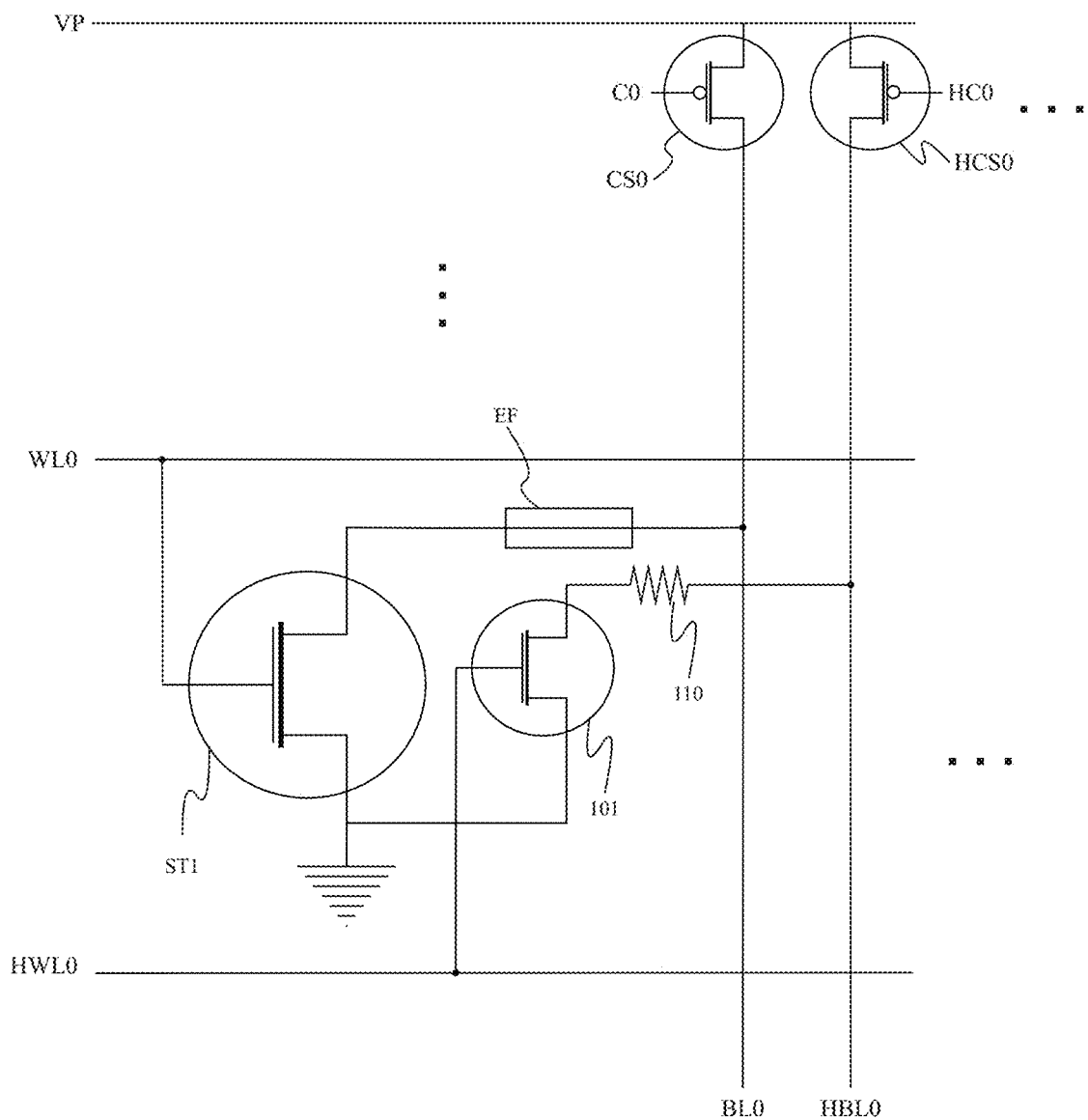
FIG. 17 is a schematic diagram of a memory device in accordance with some embodiments of the present disclosure.

FIG. 17 is a schematic diagram of a memory device 100H in accordance with some embodiments of the present disclosure. With respect to a memory cell of the memory device 100G in FIG. 15, one end of the resistor 110 in FIG. 17 is connected to a heater bit line HBL0 adjacent to the corresponding bit line BL0, and one end of the resistor 110 in FIG. 17 is connected to one end of the heating transistor 101 (e.g., a drain when the heating transistor 101 is an n-type transistor). In FIG. 17, when the select transistor ST1 is an n-type transistor, the drain of the select transistor ST1 may be connected to the fuse element EF (e.g., the cathode of the fuse element EF), and the source of the select transistor ST1 may be connected to the ground. When the heating transistor 101 is an n-type transistor, the source of the heating transistor 101 may be connected to the ground.

In some embodiments, one end of the resistor 110 in FIG. 17 is connected to a heater bit line HBL0 adjacent to the corresponding bit line BL0, and one end of the heating transistor 101 (e.g., a source when the heating transistor 101 is an n-type transistor) in FIG. 17 is connected to a node between the fuse element EF and the select transistor ST1.

In FIG. 17, the bit line BL0 is connected to the column select transistor CS0. The corresponding heater bit line HBL0 is connected to the corresponding heater column select transistor HCS0. For example, when the column select transistor CS0 and the corresponding heater column select transistor HCS0 are a p-type transistor, the bit line BL0 is connected to the drain of the column select transistor CS0, and the corresponding heater bit line HBL0 is connected to the drain of the corresponding heater column select transistor HCS0. The memory device 100H may include heater bit lines HBL1 and HBL2. The heater bit line HBL1 may be connected to the heater column select transistor HCS1. The heater bit line HBL2 may be connected to the heater column select transistor HCS2. When signal C0 is applied to turn on the column select transistor CS0, the voltage VP would be provided on the bit line BL0. When signal HC0 is applied to turn on the heater column select transistor HCS0, the voltage VP would be provided on the heater bit line HBL0. The resistor 110 and the heating transistor 101 are connected in series. When the resistor 110 is connected to the heater bit line, which is separated from the corresponding bit line, an undesired voltage drop on the corresponding bit line due to the resistor 110 and/or the heating transistor 101 would be avoided. The fuse element EF would be programmed or read more accurately and reliably because the more accurate and reliable voltage VP is provided on the bit line.

In some embodiments, the heater bit line HBL0 and the corresponding bit line BL0 may be connected to the column select transistor CS0. For example, when the column select transistor CS0 is a p-type transistor, the heater bit line HBL0 and the corresponding bit line BL0 may be connected to the drain of the column select transistor CS0. The memory device 100H may include heater bit lines HBL1 and HBL2. The heater bit line HBL1 and the corresponding bit line BL1 may be connected to the column select transistor CS1. The heater bit line HBL2 and the corresponding bit line BL2 may be connected to the column select transistor CS2. When signal C0 is applied to turn on the column select transistor CS0, the voltage VP would be provided on the bit line BL0 and the corresponding heater bit line HBL0. The resistor 110 and the heating transistor 101 are connected in series. When the resistor 110 is connected to the heater bit line, which is separated from the corresponding bit line, an undesired voltage drop on the corresponding bit line due to the resistor 110 and/or the heating transistor 101 would be avoided. The fuse element EF would be programmed or read more accurately and reliably because the more accurate and reliable voltage VP is provided on the bit line.

Referring to the memory device 100G in FIG. 15, when the heater word line HWL0 is configured to turn on the corresponding heating transistor 101 of the memory device 100G in FIG. 15 (e.g., the fuse element EF of the memory device 100G in FIG. 15 is to be programmed), the right end of the fuse element EF (e.g., the anode of the fuse element EF) in FIG. 15 may receive more heat because the heat generated by the heating transistor 101 and the resistor 110 may be conducted or transferred to the fuse element EF through the bit line. With respect to the fuse elements EF of the memory device 100G in FIG. 15, when the heater word line HWL0 is configured to turn on the corresponding heating transistor 101 of the memory device 100H in FIG. 17 (e.g., the fuse element EF of the memory device 100H in FIG. 17 is to be programmed), the right end of the fuse element EF (e.g., the anode of the fuse element EF) to be programmed may receive less heat because the heat generated by the heating transistor 101 and the resistor 110 may be rarely conducted or transferred to the fuse element EF through the bit line. The right end of the resistor 110 is connected to the heater bit line. The right end of the fuse element EF is connected to the bit line. Since the heater bit line and the bit line are separated, the heat generated by the heating transistor 101 and the resistor 110 may not be easily conducted or transferred to the right end of the fuse element EF. Thus, the right end of the fuse element EF of the memory device 100H in FIG. 17 receives less heat than the right end of the fuse element EF of the memory device 100G in FIG. 15 does.

Figure 18:
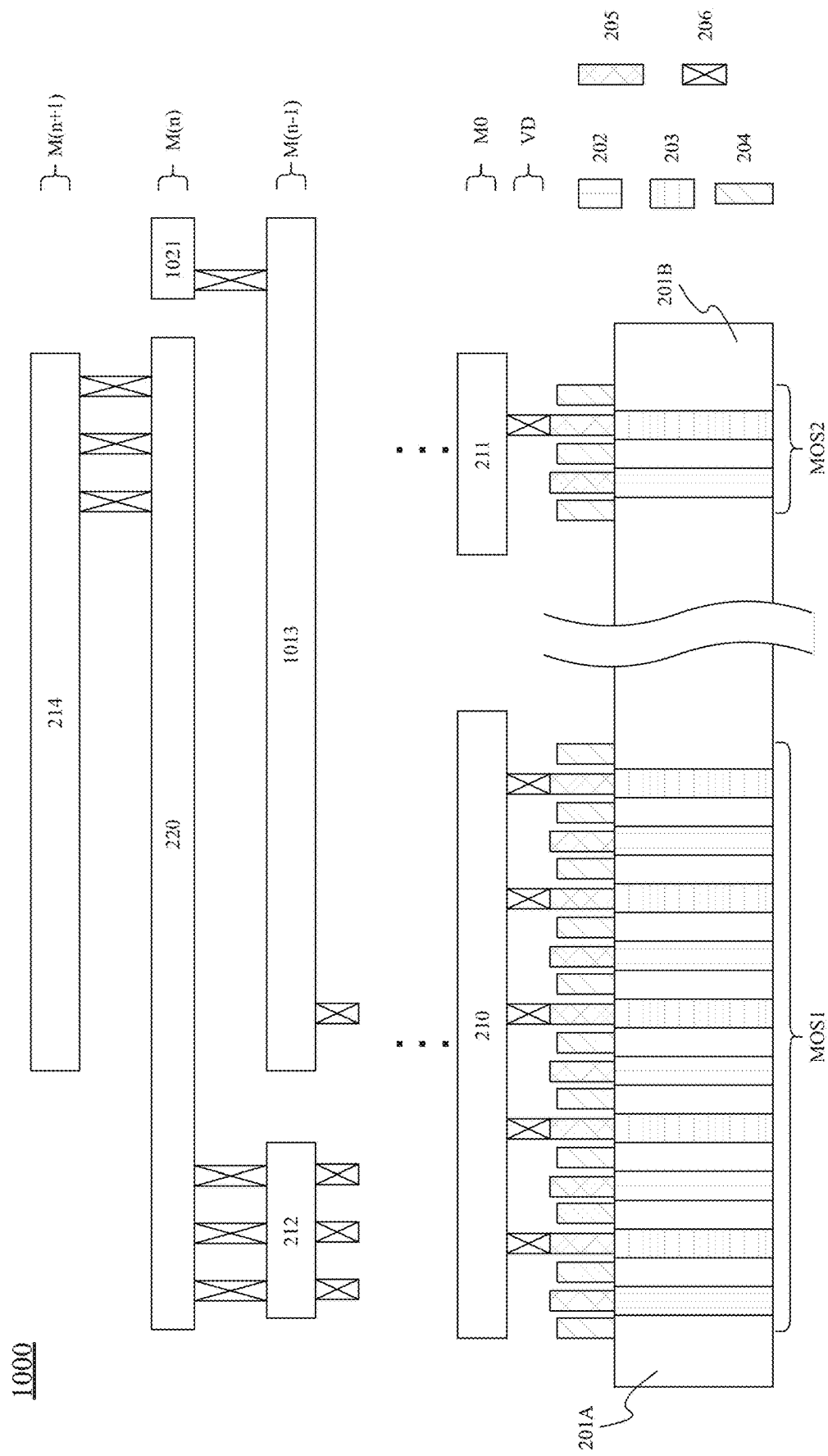
FIG. 18 is a cross-sectional view of a semiconductor device in accordance with some embodiments of the present disclosure.

FIG. 18 is a cross-sectional view of a semiconductor device 1000 in accordance with some embodiments of the present disclosure. The source/drain region 203 in the OD region 201B (e.g., the source/drain region 203 of the transistor MOS2) of the semiconductor device 1000 may be connected to the metal layer 1013 through the metal layer 211, a metal layer 205, and a via 206. The metal layer 1013 may be a resistor layer with a high resistance value. The transistor MOS1 in FIG. 18 may be the select transistor ST1 shown in FIG. 17, the transistor MOS2 in FIG. 18 may be the heating transistor 101 shown in FIG. 17, and the metal layer 1013 in FIG. 18 may be the resistor 110 shown in FIG. 17. In some embodiments, the resistor 110 shown in FIG. 17 may be a via with a high resistance value in the semiconductor device 1000.

The metal layer 210 may be connected with the source/drain regions 203 in the OD region 201A through the metal layers 205 (e.g., MD) and the vias 206 (e.g., VD). If the MOS1 transistor is an n-type MOS, the source/drain regions 203 connected to the metal layer 210 may be operated as drains. The metal layer 210 may be connected to the metal layer 220 (e.g., the fuse element). The metal layer 211 may be connected with the source/drain region 203 in the OD region 201B through the metal layer 205 (e.g., MD) and the via 206 (e.g., VD). If the MOS2 transistor is an n-type MOS, the source/drain region 203 connected to the metal layers 211 may be operated as a drain. The metal layer 211 may be connected to a resistor having a high resistance value (e.g., the metal layer 1013), and the heater bit line (e.g., the metal layer 1021 itself or through the metal layer 1021). The source/drain regions 202 in the OD regions 201A and the corresponding metal layers 205 may be connected to at least one metal layer and at least one via which are not shown in the cross-sectional view of FIG. 18. The source/drain regions 202 in the OD regions 201B and the corresponding metal layers 205 may be connected to at least one metal layer and at least one via which are not shown in the cross-sectional view of FIG. 18. The gate layers 204 may be connected to at least one metal layer and at least one via which are not shown in the cross-sectional view of FIG. 18.

The semiconductor device 1000 includes metal layers 214 and 1013. The metal layer 1013 in FIG. 18 may be a resistor layer with a high resistance value. The metal layer 1021 (e.g., the heater bit line) may be connected to the right end of the metal layer 1013, and the metal layer 211 may be connected to the left end of the metal layer 1013. The metal layer 1013 may thus have the maximum resistance value and may generate the maximum heat.

The metal layers 214 and 1013 of the semiconductor device 900 are extended. In the semiconductor device 1000, the metal layers 214 and 1013 are extended to sandwich the metal layer 220. In some embodiments, the area of the metal layer 214 projected on the XY plane may be similar to, close to, or identical to the area of the metal layer 220 projected on the XY plane. The area of the metal layer 1013 projected on the XY plane may be similar to, close to, or identical to the area of the metal layer 220 projected on the XY plane. The heat generated by the transistor MOS2 may be transferred or conducted to the metal layer 1013. The metal layer 214 generates heat because of the voltage application on the bit line (e.g., the metal layer 214 itself or through the metal layer 214). Since the metal layer 220 is sandwiched by the metal layers 214 and 1013, the heat of the metal layers 214 and 1013 would heat the metal layer 220 and/or keep the metal layer 220 warm. Because the metal layer 1013 may be a resistor layer, in addition to the heat generated from the transistor MOS2, the metal layer 1013 may further generate heat. The metal layer 220 sandwiched by the metal layers 214 and 1013 may receive more heat, and the temperature of the metal layer 220 may thus increase more quickly.

Figure 19:
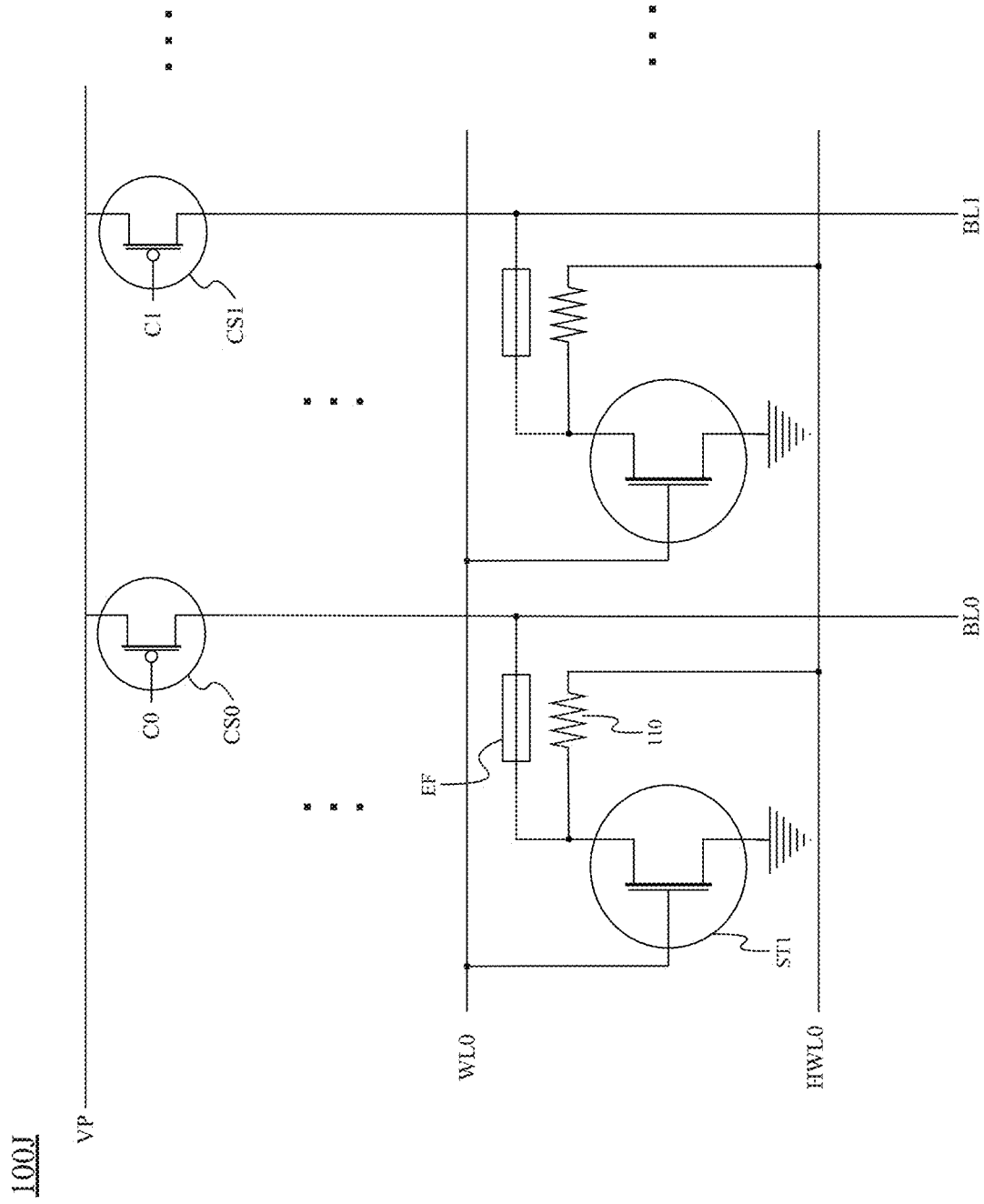
FIG. 19 is a schematic diagram of a memory device in accordance with some embodiments of the present disclosure.

FIG. 19 is a schematic diagram of a memory device 1003 in accordance with some embodiments of the present disclosure. With respect to a memory cell of the memory device 100A in FIG. 2, the memory device 1003 in FIG. 19 does not have the heating transistor 101. The memory device 100J includes a resistor 110. One end of the resistor 110 is connected to the corresponding heater word line, and the other end of the resistor 110 is connected to a node between the fuse element EF and the select transistor ST1. In FIG. 19, when the select transistor ST1 is an n-type transistor, the drain of the select transistor ST1 may be connected to the fuse element EF (e.g., the cathode of the fuse element EF), and the source of the select transistor ST1 may be connected to the ground.

Referring to the memory device 100A in FIG. 2, the left end of the fuse element EF (e.g., the anode of the fuse element EF) to be programmed may receive more heat than the right end of the same fuse element EF (e.g., the cathode of the same fuse element EF) does. With respect to the fuse elements EF of the memory device 100A in FIG. 2, when the fuse element EF of the memory device 100J in FIG. 19 is to be programmed, the heater word line HWL0 may be configured to turn on the corresponding resistor 110. The heat generated by the resistor 110 may be transferred or conducted to the left end of the fuse element EF and the heater word line through the connections. Thus, the left end of the fuse element EF (e.g., the cathode of the fuse element EF) in FIG. 19 may receive more heat than the right end of the fuse element EF (e.g., the anode of the fuse element EF) does. When the fuse element EF of the left memory cell of the memory device 100J in FIG. 19 is to be programmed, the heater word line HWL0 may be configured to turn on the corresponding resistor 110 the left memory cell and the resistors 110 in the same row of memory cells (e.g., the resistor 110 in the right memory cell).

Figure 20:
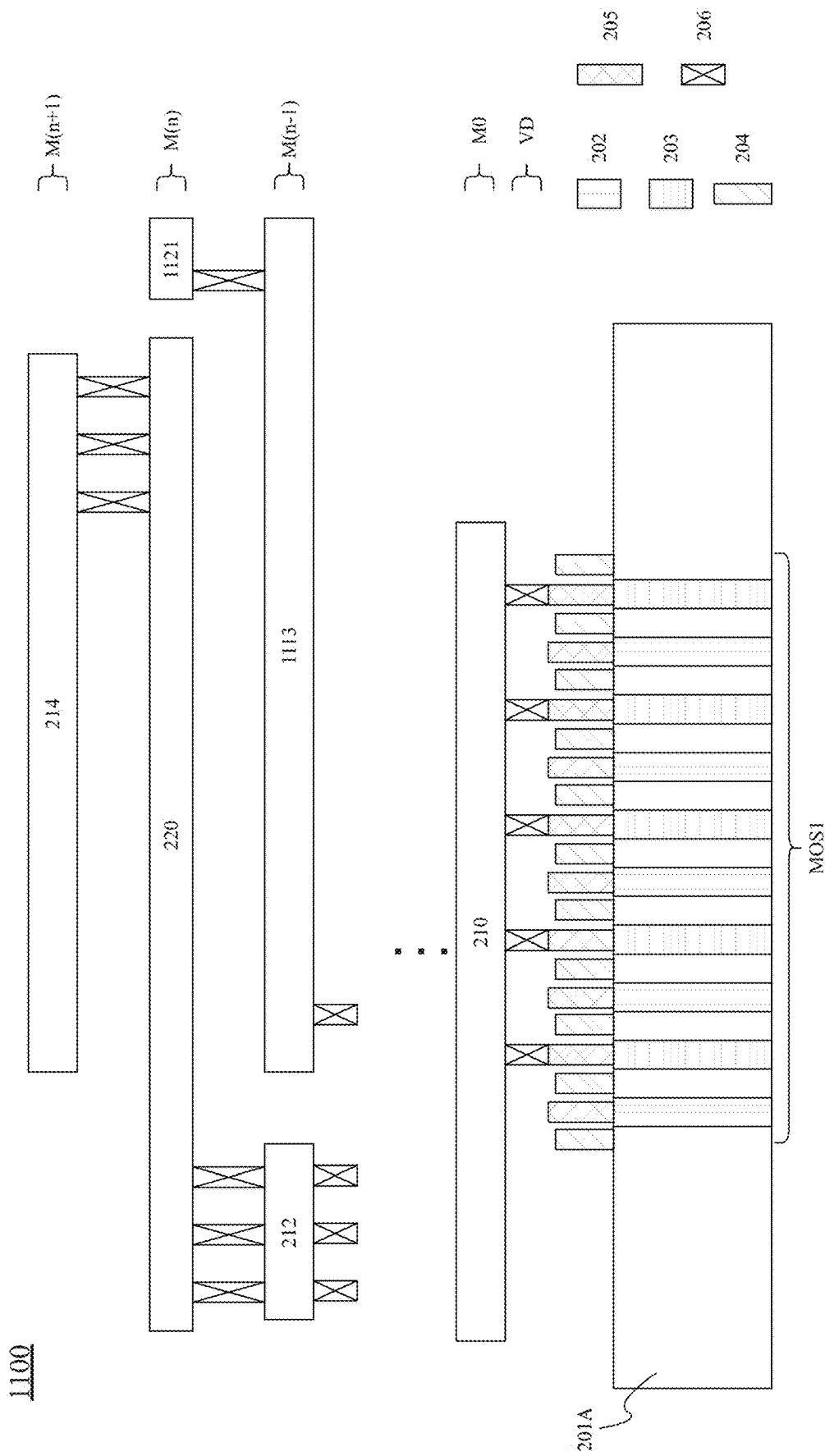
FIG. 20 is a cross-sectional view of a semiconductor device in accordance with some embodiments of the present disclosure.

FIG. 20 is a cross-sectional view of a semiconductor device 1100 in accordance with some embodiments of the present disclosure. With respect to the semiconductor 200B shown in FIG. 3B, the semiconductor device 1100 in FIG. 20 does not have the OD region 201B or the transistor MOS2 formed in the OD region 201B. In the semiconductor device 1100, the source/drain regions 203 formed in the OD region 201A (e.g., the source/drain region 203 of the transistor MOS1) may be connected to the metal layer 210 through a metal layer 205 and a via 206. The source/drain regions 203 in the OD region 201A (e.g., the source/drain region 203 of the transistor MOS1) of the semiconductor device 1100 may be connected to the metal layer 1113 through the metal layer 210. The metal layer 1113 may be a resistor layer with a high resistance value. The transistor MOS1 in FIG. 20 may be the select transistor ST1 shown in FIG. 19, and the metal layer 1113 in FIG. 20 may be the resistor 110 shown in FIG. 19. In some embodiments, the resistor 110 shown in FIG. 19 may be a via with a high resistance value in the semiconductor device 1100.

The metal layer 210 may be connected with the source/drain regions 203 in the OD region 201A through the metal layers 205 (e.g., MD) and the vias 206 (e.g., VD). If the MOS1 transistor is an n-type MOS, the source/drain regions 203 connected to the metal layer 210 may be operated as drains. The metal layer 210 may be connected to the metal layer 220 (e.g., the fuse element) through the metal layer 212 and the corresponding vias 206. The metal layer 220 may be connected to the metal layer 214 (e.g., the bit line) through corresponding vias 206. The metal layer 1113 may be connected to the source/drain regions 203 in the OD region 201A through the metal layer 210. The metal layer 1113 may be connected to the heater word line (e.g., the metal layer 1121 itself or through the metal layer 1121)). The source/drain regions 202 in the OD regions 201A and the corresponding metal layers 205 may be connected to at least one metal layer and at least one via which are not shown in the cross-sectional view of FIG. 20. The gate layers 204 may be connected to at least one metal layer and at least one via which are not shown in the cross-sectional view of FIG. 20.

The semiconductor device 1100 includes metal layers 214 and 1113. The metal layer 1113 in FIG. 20 may be a resistor layer with a high resistance value. The metal layer 1121 (e.g., the heater word line) may be connected to the right end of the metal layer 1113, and the metal layer 210 may be connected to the left end of the metal layer 1113. The metal layer 1113 may thus have the maximum resistance value and may generate the maximum heat.

The metal layers 214 and 1113 of the semiconductor device 1100 are extended. In the semiconductor device 1100, the metal layers 214 and 1113 are extended to sandwich the metal layer 220. In some embodiments, the area of the metal layer 214 projected on the XY plane may be similar to, close to, or identical to the area of the metal layer 220 projected on the XY plane. The area of the metal layer 1113 projected on the XY plane may be similar to, close to, or identical to the area of the metal layer 220 projected on the XY plane. The metal layer 1113 generates heat due to the high resistance value. The metal layer 214 generates heat because of the voltage application on the bit line (e.g., the metal layer 214 itself or through the metal layer 214). Since the metal layer 220 is sandwiched by the metal layers 214 and 1113, the heat of the metal layers 214 and 1113 would heat the metal layer 220 and/or keep the metal layer 220 warm. The metal layer 220 sandwiched by the metal layers 214 and 1113 may receive more heat, and the temperature of the metal layer 220 may thus increase more quickly.

Figure 21:
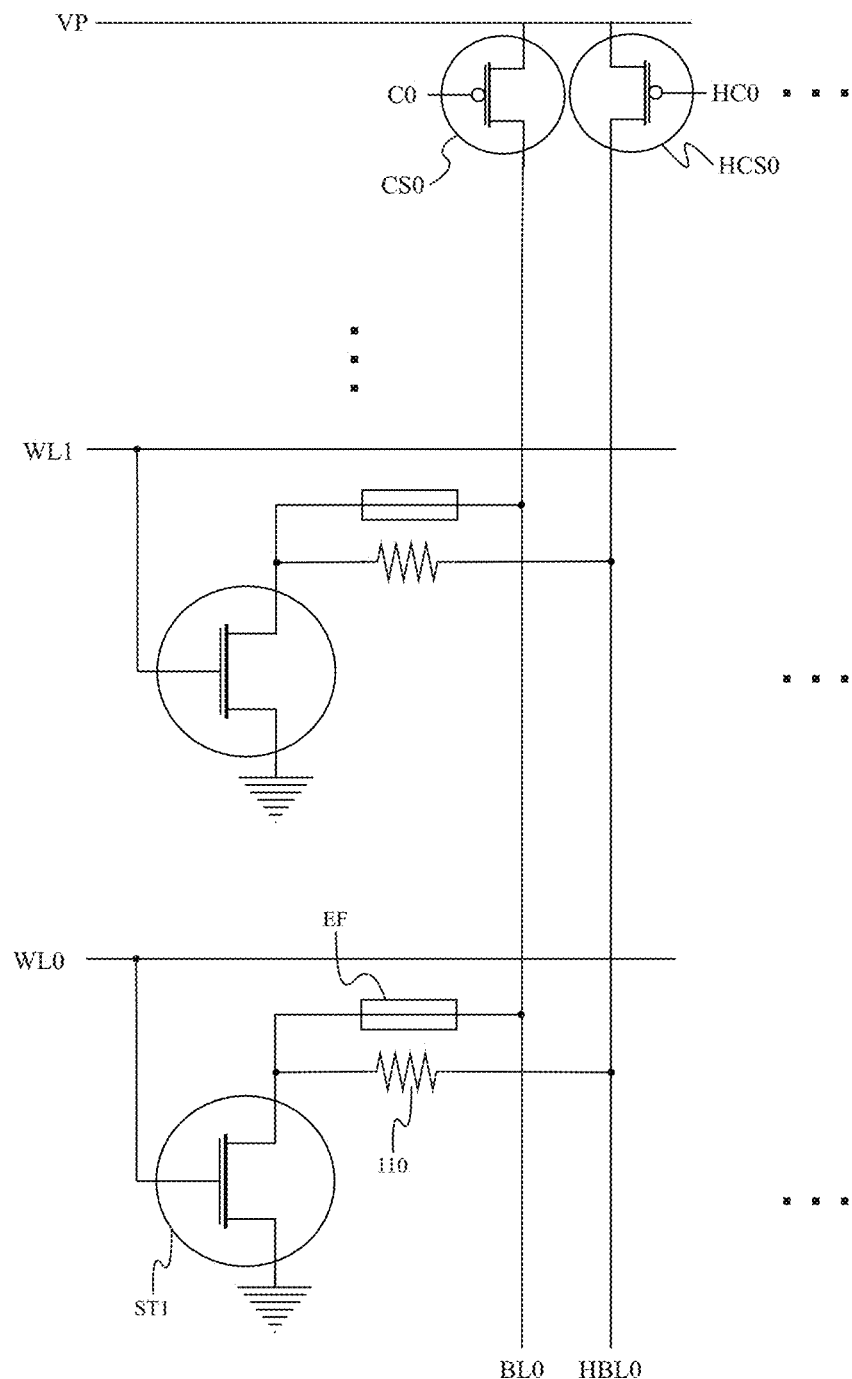
FIG. 21 is a schematic diagram of a memory device in accordance with some embodiments of the present disclosure.

FIG. 21 is a schematic diagram of a memory device 100K in accordance with some embodiments of the present disclosure. With respect to a memory cell of the memory device 100A in FIG. 2, the memory device 100K in FIG. 21 does not have the heating transistor 101. The memory device 100K includes a resistor 110. One end of the resistor 110 is connected to the corresponding heater bit line, and the other end of the resistor 110 is connected to a node between the fuse element EF and the select transistor ST1. The memory device 100K does not include a heater word line. In FIG. 21, when the select transistor ST1 is an n-type transistor, the drain of the select transistor ST1 may be connected to the fuse element EF (e.g., the cathode of the fuse element EF) and the source of the select transistor ST1 may be connected to the ground.

Referring to the memory device 100A in FIG. 2, the left end of the fuse element EF (e.g., the anode of the fuse element EF) to be programmed may receive more heat than the right end of the same fuse element EF (e.g., the cathode of the same fuse element EF) does. When the fuse element EF of the memory device 100K in FIG. 21 is to be programmed, the corresponding bit line and the corresponding heater bit line may be configured to be applied with the program voltage VP. The heat generated by the resistor 110 may be transferred or conducted to the left end of the fuse element EF through the connections. Thus, the left end of the fuse element EF (e.g., the cathode of the fuse element EF) in FIG. 21 may receive more heat than the right end of the fuse element EF (e.g., the anode of the fuse element EF) does. When the fuse element EF of the lower memory cell of the memory device 100J in FIG. 21 is to be programmed, the bit line and the heater bit line, which are used for the same column of memory cells, may be configured (e.g., through the column select transistor CS0 and the heater columns select transistor HCS0) to be applied with the program voltage VP. No current would pass through the resistor 110 of the upper memory cell of the memory device 100J because the select transistor ST1 is not turned on by the word line WL1.

Figure 22:
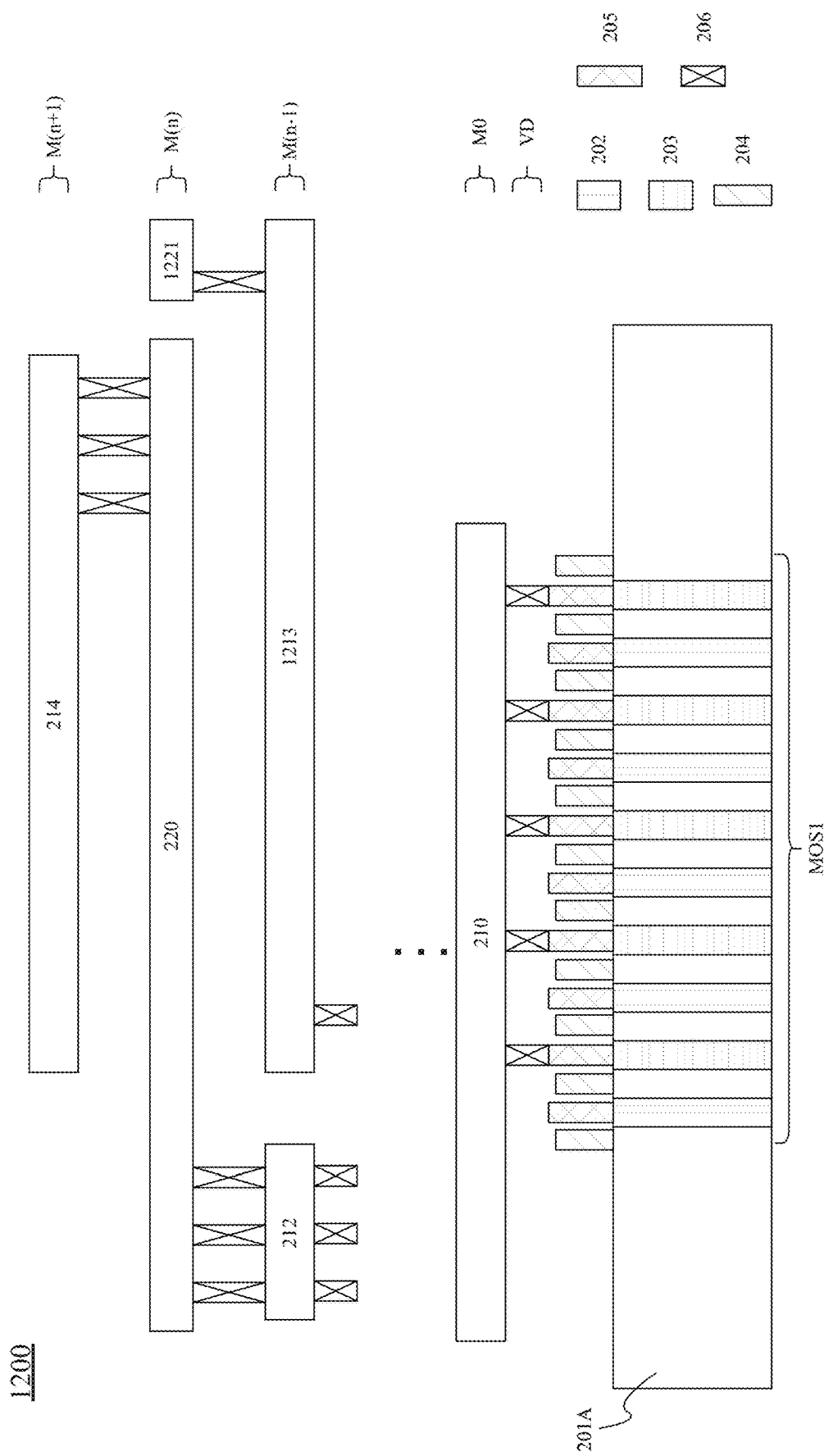
FIG. 22 is a cross-sectional view of a semiconductor device in accordance with some embodiments of the present disclosure.

FIG. 22 is a cross-sectional view of a semiconductor device 1200 in accordance with some embodiments of the present disclosure. With respect to the semiconductor 200B shown in FIG. 3B, the semiconductor device 1200 in FIG. 22 does not have the OD region 201B or the transistor MOS2 formed in the OD region 201B. In the semiconductor device 1200, the source/drain regions 203 formed in the OD region 201A (e.g., the source/drain region 203 of the transistor MOS1) may be connected to the metal layer 210 through a metal layer 205 and a via 206. The source/drain regions 203 in the OD region 201A (e.g., the source/drain region 203 of the transistor MOS1) of the semiconductor device 1200 may be connected to the metal layer 1213 through the metal layer 210. The metal layer 1213 may be a resistor layer with a high resistance value. The transistor MOS1 in FIG. 22 may be the select transistor ST1 shown in FIG. 21, and the metal layer 1213 in FIG. 22 may be the resistor 110 shown in FIG. 21. In some embodiments, the resistor 110 shown in FIG. 21 may be a via with a high resistance value in the semiconductor device 1200.

The metal layer 210 may be connected with the source/drain regions 203 in the OD region 201A through the metal layers 205 (e.g., MD) and the vias 206 (e.g., VD). If the MOS1 transistor is an n-type MOS, the source/drain regions 203 connected to the metal layer 210 may be operated as drains. The metal layer 210 may be connected to the metal layer 220 (e.g., the fuse element) through the metal layer 212 and the corresponding vias 206. The metal layer 220 may be connected to the metal layer 214 (e.g., the bit line) through corresponding vias 206. The metal layer 1213 may be connected to the source/drain regions 203 in the OD region 201A through the metal layer 210. The metal layer 1213 may be connected to the heater bit line (e.g., the metal layer 1221 itself or through the metal layer 1221). The source/drain regions 202 in the OD regions 201A and the corresponding metal layers 205 may be connected to at least one metal layer and at least one via which are not shown in the cross-sectional view of FIG. 22. The gate layers 204 may be connected to at least one metal layer and at least one via which are not shown in the cross-sectional view of FIG. 22.

The semiconductor device 1200 includes metal layers 214 and 1213. The metal layer 1213 in FIG. 22 may be a resistor layer with a high resistance value. The metal layer 1221 (e.g., the heater bit line) may be connected to the right end of the metal layer 1213, and the metal layer 210 may be connected to the left end of the metal layer 1213. The metal layer 1213 may thus have the maximum resistance value and may generate the maximum heat.

The metal layers 214 and 1213 of the semiconductor device 1200 are extended. In the semiconductor device 1200, the metal layers 214 and 1213 are extended to sandwich the metal layer 220. In some embodiments, the area of the metal layer 214 projected on the XY plane may be similar to, close to, or identical to the area of the metal layer 220 projected on the XY plane. The area of the metal layer 1213 projected on the XY plane may be similar to, close to, or identical to the area of the metal layer 220 projected on the XY plane. The metal layer 1213 generates heat due to the high resistance value. The metal layer 214 generates heat because of the voltage application on the bit line (e.g., the metal layer 214 itself or through the metal layer 214). Since the metal layer 220 is sandwiched by the metal layers 214 and 1213, the heat of the metal layers 214 and 1213 would heat the metal layer 220 and/or keep the metal layer 220 warm. The metal layer 220 sandwiched by the metal layers 214 and 1213 may receive more heat, and the temperature of the metal layer 220 may thus increase more quickly.

Figure 23:
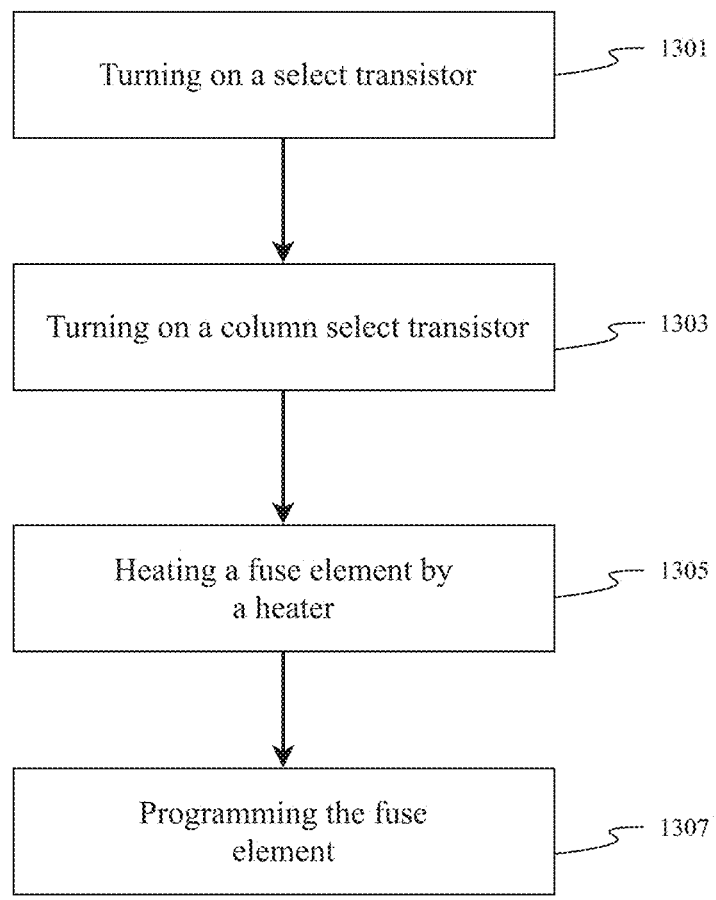
FIG. 23 is a flowchart of a method for operating a memory device in accordance with some embodiments of the present disclosure.

FIG. 23 is a flowchart of a method 1300 for operating a memory device in accordance with some embodiments of the present disclosure. The method 1300 includes the operation 1301. In the operation 1301, a select transistor (e.g., the select transistor ST1) is turned on. The select transistor may be turned on by a row select signal transmitted on a word line. The select transistor may be turned on by a row select voltage applied to the select transistor. In some embodiments, a controller may transmit a row select signal on a word line to turn on the corresponding one or more select transistors. A controller may apply a row select voltage to turn on the corresponding one or more select transistors.

The method 1300 includes the operation 1303. In the operation 1303, a column select transistor (e.g., the column select transistor CS0) is turned on. The column select transistor may be turned on by a column select signal transmitted to the column select transistor. The column select transistor may be turned on by a column select voltage applied to the column select transistor. In some embodiments, a controller may transmit a column select signal to turn on the corresponding column select transistor. A controller may apply a column select voltage to turn on the corresponding column.

The method 1300 includes the operation 1305. In the operation 1305, a fuse element (e.g., the fuse element EF) is heated by a heater. The fuse element being heated may be disposed in the memory cell selected by the select transistor and the column select transistor. The heater may be a heating transistor, a heating resistor, or a combination of the above.

The method 1300 includes the operation 1307. In the operation 1307, the fuse element (e.g., the fuse element EF) is programmed. The fuse element being heated may be disposed in the memory cell selected by the select transistor and the column select transistor. The fuse element may be programmed by a program voltage provided on the corresponding bit line. The fuse element may be programmed or written by burning the fuse element from a low resistance state to a high resistance state or a complete open circuit.

In some embodiments, the method 1300 may further comprise enabling the heater by a heater word line. The heater word line corresponds to the memory cell selected by the select transistor and the column select transistor. The heater may be enabled by the heater word line when the fuse element is programmed or written.

In some embodiments, the method 1300 may further comprise providing a program voltage to the heater from a heater bit line. The heater word line corresponds to the memory cell selected by the select transistor and the column select transistor. The program voltage may be provided to program the fuse element. The program may be provided to the fuse element from the corresponding bit line.

In some embodiments, the present disclosure provides a memory device. The memory device includes a memory cell, a bit line, a word line, a select transistor, a fuse element, and a heater. The bit line is connected to the memory cell. The word line is connected to the memory cell. The select transistor is disposed in the memory cell. A gate of the select transistor is connected to the word line. The fuse element is disposed in the memory cell. The fuse element is connected to the bit line and the select transistor. The heater is configured to heat the fuse element.

In some embodiments, the present disclosure provides a semiconductor device. The semiconductor device includes an oxide diffusion area, a select transistor, a weak link, and a heater. The select transistor is formed on the oxide diffusion area. The weak link is formed over the oxide diffusion area. The weak link is configured to connect with the selector transistor. The heater is configured to connect with the weak link and heat the weak link.

In some embodiments, the present disclosure provides a method of operating a memory device. The method includes turning on a select transistor; turning on a column select transistor; heating a fuse element by a heater, the fuse element being disposed in a memory cell selected by the select transistor and the column select transistor; and programming the fuse element.

The scope of the present application is not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps/operations. In addition, each claim constitutes a separate embodiment, and the combination of various claims and embodiments are within the scope of the disclosure.

What is claimed is:

1. A memory device, comprising:
a memory cell;
a bit line connected to the memory cell;
a word line connected to the memory cell;
a select transistor in the memory cell, a gate of the select transistor connected to the word line;
a fuse element in the memory cell, the fuse element connected the select transistor; and
a heater configured to heat the fuse element, wherein the heater includes a heating transistor, and a ratio of the size of the select transistor to the size of the heating transistor is between a range from 5 to 10.

2. The memory device of claim 1, wherein:
a gate of the heating transistor is connected to a heater word line, and
the heating transistor is turned on by the heater word line during the memory cell is programed.

3. The memory device of claim 1, wherein:
one of a source and a drain of the heating transistor is connected to the ground or a node between the fuse element and the select transistor.

4. The memory device of claim 1, wherein:
one of a source and a drain of the heating transistor is connected to a heater bit line, and
the heater bit line is connected to a column select transistor and a power source.

5. The memory device of claim 1, wherein the heater further includes a heating resistor connected to the heating transistor.

6. The memory device of claim 1, wherein the heater includes a heating resistor.

7. The memory device of claim 6, wherein:
the heating resistor is enabled by a voltage on the heater word line when the memory cell is to be programmed.

8. The memory device of claim 6, wherein:
the heating resistor is connected to a heater bit line, and
the heater bit line is connected to a column select transistor and a power source.

9. A semiconductor device, comprising:
an oxide diffusion area;
a select transistor formed on the oxide diffusion area;
a weak link formed over the oxide diffusion area, the weak link configured to connect with the selector transistor; and
a heater configured to connect with the weak link and heat the weak link, wherein the heater includes a heating transistor, and a ratio of the size of the select transistor to the size of the heating transistor is between a range from 5 to 10.

10. The method of claim 1, wherein the fuse element is connected between the bit line and the select transistor.

11. The method of claim 1, wherein the fuse element is connected between the select transistor and the ground.

12. The semiconductor device of claim 9, wherein:
the heater heats the weak link when the weak link is to be programmed to have a high resistance value.

13. The semiconductor device of claim 9, wherein:
heat from the heater to the weak link is conducted through an oxide diffusion region, one or more metal layers, or one or more vias.

14. The semiconductor device of claim 9, wherein the weak link is sandwiched by two metal layers.

15. The semiconductor device of claim 9, wherein:
the heater is connected to a heater bit line separated from a bit line.

16. The semiconductor device of claim 9, wherein the heater includes a via resistor and a resistor layer formed adjacent to the weak link.

17. The semiconductor device of claim 9, wherein:
the heater is connected to a heater word line.

18. A method of operating a memory device, comprising:
turning on a select transistor;
turning on a column select transistor;
heating a fuse element by a heater, the fuse element is disposed in a memory cell selected by the select transistor and the column select transistor, wherein the heater includes a heating transistor, and a ratio of the size of the select transistor to the size of the heating transistor is between a range from 5 to 10; and
programming the fuse element.

19. The method of claim 18, further comprising:
enabling the heater by a heater word line during programming the fuse element.

20. The method of claim 18, further comprising:
providing a program voltage to the heater from a heater bit line, wherein the program voltage is provided to program the fuse element.

* * * * *